US009325168B2

(12) United States Patent
Kurokawa

(10) Patent No.: US 9,325,168 B2
(45) Date of Patent: Apr. 26, 2016

(54) SEMICONDUCTOR DEVICE

(71) Applicant: Renesas Electronics Corporation, Kawasaki-shi, Kanagawa (JP)

(72) Inventor: Tatsufumi Kurokawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/527,863

(22) Filed: Oct. 30, 2014

(65) Prior Publication Data

US 2015/0048874 A1     Feb. 19, 2015

Related U.S. Application Data

(63) Continuation of application No. 14/097,641, filed on Dec. 5, 2013, now Pat. No. 8,901,985.

(30) Foreign Application Priority Data

Feb. 28, 2013   (JP) ................................. 2013-039693

(51) Int. Cl.
*H03L 5/00*     (2006.01)
*H02H 9/04*     (2006.01)
*H01L 27/02*    (2006.01)

(52) U.S. Cl.
CPC ............. *H02H 9/04* (2013.01); *H01L 27/0285* (2013.01)

(58) Field of Classification Search
CPC .. H01L 27/0266; H01L 27/0285; H02H 9/04; H02H 9/046
See application file for complete search history.

(56) References Cited

U.S. PATENT DOCUMENTS

| 7,274,543 | B2 * | 9/2007 | Nishikawa | .......... H01L 27/0266 361/56 |
| 8,054,596 | B2 | 11/2011 | Koyama et al. | |
| 8,228,109 | B2 | 7/2012 | Stockinger et al. | |
| 8,704,578 | B2 | 4/2014 | Kurokawa | |
| 2009/0091872 | A1 * | 4/2009 | Ueda | ........................ H02H 3/20 361/91.1 |
| 2012/0286843 | A1 | 11/2012 | Kurokawa | |

FOREIGN PATENT DOCUMENTS

| JP | 2009-246347 A | 10/2009 |
| JP | 2012-238693 A | 12/2012 |

* cited by examiner

*Primary Examiner* — Jeffrey Zweizig
(74) *Attorney, Agent, or Firm* — Sughrue Mion, PLLC

(57) ABSTRACT

Disclosed is a semiconductor device that includes an N-channel MOS transistor and a control voltage generation circuit. The N-channel MOS transistor controls the supply of a power supply voltage obtained by stepping down a DC voltage. The control voltage generation circuit clips the gate voltage of the N-channel MOS transistor at a control voltage not higher than a predetermined voltage in accordance with the DC voltage.

8 Claims, 15 Drawing Sheets

SEMICONDUCTOR DEVICE

CROSS-REFERENCE TO RELATED APPLICATIONS

This application is a continuation application of U.S. application Ser. No. 14/097,641, filed Dec. 5, 2013, which claims priority based on Japanese Patent Application No. 2013-039693 filed on Feb. 28, 2013, the disclosures of which are incorporated herein by reference in their entirety.

BACKGROUND

The present invention relates to a semiconductor device, and more particularly to a semiconductor device having an overvoltage protection circuit.

In recent years, it is demanded that vehicle-mounted products be designed with functional safety in mind. For example, ISO 26262 is a functional safety standard. The assurance of functional safety includes the following stages.

(1) Detecting an abnormality and bringing an operation to a stop. (2) Switching to a normal circuit upon detection of an abnormality and maintaining an operation.

Automakers and automotive components manufacturers are making efforts to achieve functional safety by first reaching stage (1) and then reaching stage (2) in the future.

Meanwhile, stringent cost requirements are imposed on a vehicle-mounted semiconductor integrated circuit (semiconductor IC). Thus, it is necessary that a small, low-voltage transistor be effectively used to form a small IC. Further, if the IC operates on a vehicle-mounted battery, it must work normally under the following conditions:
(1) A voltage of approximately 12.5 V is applied to the IC during a normal operation.
(2) The IC must be capable of operating at a low voltage when a crank pulse is input. For example, a battery voltage suddenly decreases to 3.9 V when recovery is achieved from idling.
(3) A surge voltage is applied to the IC in the event, for instance, of a load dump. For example, a surge voltage as high as 40 V is applied for a period as short as 0.4 s.

In order to perform normal operations under the above conditions, that is, in order to operate upon the application of a high voltage from a battery and use a low-voltage circuit formed of low-voltage elements, the IC incorporates a step-down circuit (e.g., a dropper circuit) based on a high-voltage transistor. In this instance, the low-voltage circuit in the IC operates on a constant voltage that is derived from a battery voltage by the step-down circuit. This ensures that the low-voltage circuit formed of low-voltage elements can use a high voltage applied from the battery.

A semiconductor device described, for instance, in Japanese Unexamined Patent Publication No. 2012-238693 uses a high-voltage element to control the supply of a power supply voltage derived from a battery voltage.

FIG. 1 is a diagram illustrating the configuration of the semiconductor device described in Japanese Unexamined Patent Publication No. 2012-238693. Referring to FIG. 1, the semiconductor device includes a to-be-protected circuit (low voltage circuit 800) and a protection circuit 700, which is disposed between the low-voltage circuit 800 and a power supply that supplies a power supply voltage VIN. The protection circuit 700 includes a P-channel MOS transistor 701, zener diodes 702, 704, and a resistor 703. The source and drain of the P-channel MOS transistor 701 are coupled between the power supply and the low-voltage circuit 800. The gate of the P-channel MOS transistor 701 is coupled to the power supply through the zener diode 702 and coupled to a reference power supply (e.g., GND) through the resistor 703. The anode of the zener diode 702 is coupled to the gate of the P-channel MOS transistor 701 and coupled to the reference power supply through the resistor 703. The cathode of the zener diode 702 is coupled between the power supply and the source of the P-channel MOS transistor. The cathode of the zener diode 704 is coupled between the low-voltage circuit 800 and the drain of the P-channel MOS transistor. The anode of the zener diode 704 is coupled to the reference power supply.

Under normal conditions, that is, when the power supply voltage VIN is not higher than a predetermined voltage, no current flows to the zener diode 702. Therefore, the gate-source voltage of the P-channel MOS transistor is equal to a reference power supply voltage (e.g., ground voltage)–VIN. As the P-channel MOS transistor is on, a power supply voltage VD supplied to the low-voltage circuit 800 is at substantially the same potential as the power supply voltage VIN.

Meanwhile, if the power supply voltage VIN rises above the predetermined voltage, the zener diode 702 breaks down. In this instance, the gate-source voltage of the P-channel MOS transistor 701 is clipped at the breakdown voltage of the zener diode 702. This limits the amount of current to be supplied from the P-channel MOS transistor 701 to the low-voltage circuit 800.

When the power supply voltage VIN rises, the power supply voltage VD also rises, thereby causing the zener diode 704 to break down. In this instance, the amount of current supplied from the P-channel MOS transistor 701 is set to be not larger than the amount of allowable current that can flow to the zener diode 704. This ensures that the power supply voltage VD is clipped at the breakdown voltage of the zener diode 704. In other words, even if the power supply voltage VIN unduly rises, the zener diode 704 clips the power supply voltage VD at a predetermined voltage, thereby protecting the low-voltage circuit 800.

Meanwhile, a semiconductor device described in Japanese Unexamined Patent Publication No. 2009-246347 switches the power supply voltage to be supplied to an internal circuit (functional circuit). As shown in FIGS. 1 and 2 of Japanese Unexamined Patent Publication No. 2009-246347, a protection circuit having a switching element and a resistive element is parallel-coupled between the functional circuit and a first potential supply terminal. If the potential difference applied between the first potential supply terminal and a second potential supply terminal is equal to a predetermined value, the switching element supplies a power supply voltage to the functional circuit. If, on the other hand, an overvoltage is applied, the resistive element supplies the power supply voltage to the functional circuit.

SUMMARY

The semiconductor device described in Japanese Unexamined Patent Publication No. 2012-238693 protects the low-voltage circuit 800 against an overvoltage by clipping the power supply voltage VD at the breakdown voltage of the zener diode 704. In this instance, the amount of current supplied to the low-voltage circuit 800 is determined by the on-resistance of the P-channel MOS transistor and the amount of current flowing to the zener diode 704. Therefore, when the amount of current to be supplied to a load circuit to which the power supply voltage VD is applied, it is necessary to decrease the on-resistance of the P-channel MOS transistor 701. In this instance, in order to perform the above-described clipping to suppress an increase in the power supply voltage VD, which may be caused by the application of an overvoltage, it is necessary to increase the amount of current flowing to the zener diode 704. In other words, when the amount of current to be supplied to the load circuit is to be increased, it is necessary to increase not only the size of the P-channel MOS transistor 701 but also the size of the zener diode 704, which functions as a protection circuit. This will result in an increase in the size of circuitry.

The semiconductor device described in Japanese Unexamined Patent Publication No. 2009-246347 operates so that the switching element turns off to let the resistive element supply the power supply voltage when an overvoltage is encountered. However, if an even higher voltage is applied to the first potential supply terminal, the resistive element cannot sufficiently reduce the voltage, thereby allowing an overvoltage to be applied to the functional circuit. Further, in order to increase the amount of current flowing through the resistive element, it is necessary to lower the resistance of the resistive element. However, the use of a low-resistance resistive element lessens the effect of overvoltage protection.

Under the above circumstances, it is demanded that a load circuit be protected against an overvoltage while electrical power derived from a DC voltage is steadily supplied to the load circuit with an increase in the size of circuitry suppressed.

According to an aspect of the present invention, there is provided a semiconductor device including an N-channel MOS transistor and a control voltage generation circuit. The N-channel MOS transistor controls the supply of a power supply voltage obtained by stepping down a DC voltage. The control voltage generation circuit clips the gate voltage of the N-channel MOS transistor at a control voltage not higher than a predetermined voltage in accordance with the DC voltage.

The above aspect of the present invention makes it possible to protect a load circuit against an overvoltage while steadily supplying electrical power derived from a DC voltage to the load circuit with an increase in the size of circuitry suppressed.

BRIEF DESCRIPTION OF THE DRAWINGS

Embodiments of the present invention will be described in detail based on the following figures, in which.

DETAILED DESCRIPTION

<Overview>

Figure 1:
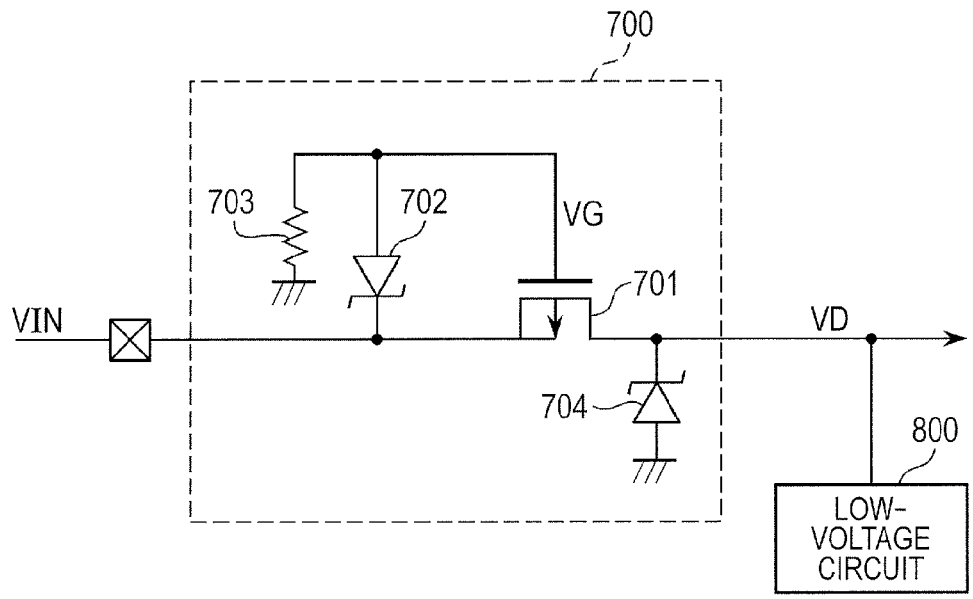
FIG. 1 is a diagram illustrating the configuration of a related-art semiconductor device.

A semiconductor device according to an aspect of the present invention not only functions as a power supply circuit that receives an input voltage (low power supply voltage) generated by stepping down a DC voltage (high power supply voltage) and outputs the received input voltage to a load circuit as an output voltage (output power supply voltage), but also functions as a protection circuit that prevents an overvoltage from being applied to the load circuit. The semiconductor device includes an N-channel MOS transistor whose drain and source are coupled between a node to which the input voltage is applied and a node coupled to the load circuit. In this aspect, as a constant voltage generated in accordance with the DC voltage is applied to the gate of the N-channel MOS transistor, the output voltage applied to the load circuit is maintained not higher than a voltage that is determined by subtracting a threshold voltage of the N-channel MOS transistor from the voltage applied to the gate of the N-channel MOS transistor. This prevents the input voltage, which is increased due to an increase in the DC voltage, from being applied to the load circuit. In this instance, as the on-resistance of the N-channel MOS transistor is low, a necessary current is supplied to the load circuit through the N-channel MOS transistor.

The semiconductor device according to the aspect of the present invention further includes a P-channel MOS transistor and a current mirror circuit. The drain and source of the P-channel MOS transistor are parallel-coupled to the N-channel MOS transistor. The current mirror circuit sets the gate voltage of the P-channel MOS transistor by using a mirror current dependent on the input voltage. If the input voltage is higher than a predetermined value, the gate voltage of the P-channel MOS transistor increases due to voltage division by a resistor through which the mirror current flows. Thus, the P-channel MOS transistor turns off. In this instance, the magnitude of the output voltage is determined by the N-channel MOS transistor whose gate voltage is limited, as mentioned earlier. When the input voltage is lower than the predetermined value, the mirror current decreases. This lowers the gate voltage of the P-channel MOS transistor to a reference power supply voltage level (e.g., ground voltage GND), thereby turning on the P-channel MOS transistor. Consequently, the input voltage is applied to the load circuit through the P-channel MOS transistor as the output voltage (power supply voltage).

Further, the semiconductor device according to the aspect of the present invention includes an overvoltage detection circuit and a delay circuit. The overvoltage detection circuit detects whether the input voltage is an overvoltage. Depending on the result of the detection, the overvoltage detection circuit controls the gate voltages of the N-channel MOS transistor and P-channel MOS transistor to shut off the supply of the power supply voltage to the load circuit.

Embodiments of the present invention will now be described with reference to the accompanying drawings. In the drawings, identical, similar, or equivalent elements are designated by identical or similar reference numerals. In the following description, it is assumed that a reference voltage supplied from a low-voltage reference power supply is a ground voltage GND. Obviously, the reference voltage is not limited to the ground voltage GND, but may be any voltage lower than a high power supply voltage VH supplied from a high-voltage power supply.

1. First Embodiment

<Configuration>

Figure 2:
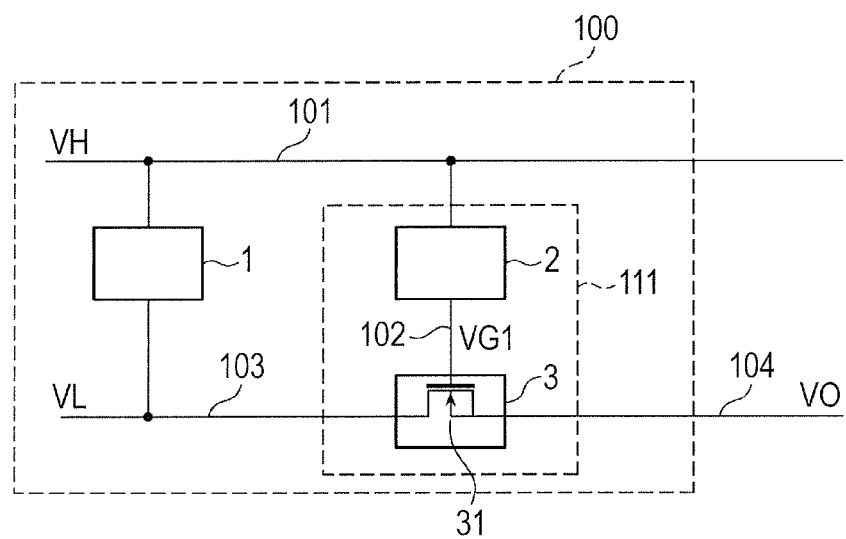
FIG. 2 is a diagram illustrating an exemplary configuration of a semiconductor device according to a first embodiment of the present invention.

The configuration of a semiconductor device 100 according to a first embodiment of the present invention will now be described in detail with reference to FIGS. 2 to 5B. FIG. 2 is a diagram illustrating an exemplary configuration of the semiconductor device 100 according to the first embodiment. Referring to FIG. 2, the semiconductor device 100 includes a step-down circuit 1 and a first protection circuit 111. The first protection circuit 111 includes a first control voltage generation circuit 2 and a first output voltage control circuit 3. The step-down circuit 1 is coupled between a node 103 and a node 101 to which a high power supply voltage VH, that is, a DC voltage, is applied. The step-down circuit 1 applies a low power supply voltage VL to the node 103. The low power supply voltage VL is generated by stepping down the high power supply voltage VH. The first control voltage generation circuit 2, which is coupled between the node 101 and the first output voltage control circuit 3, applies a control voltage VG1, which is dependent on the high power supply voltage VH, to the first output voltage control circuit 3. The first output voltage control circuit 3 includes an N-channel MOS transistor 31. The drain and source of the N-channel MOS transistor 31 are coupled between the node 103 and a node 104. The control voltage VG1 is applied to the gate of the N-channel MOS transistor 31. The N-channel MOS transistor 31 controls the coupling (resistance) between the node 103 and the node 104 in accordance with the control voltage VG1 in order to control the magnitude of an output power supply voltage VO, which is applied from the node 103 to the node 104. The output power supply voltage VO is a voltage that is supplied as a power supply voltage for the high-voltage side of a load circuit (not shown) and different from a power supply voltage (e.g., ground voltage GND) for the low-voltage side of the load circuit.

Figure 3:
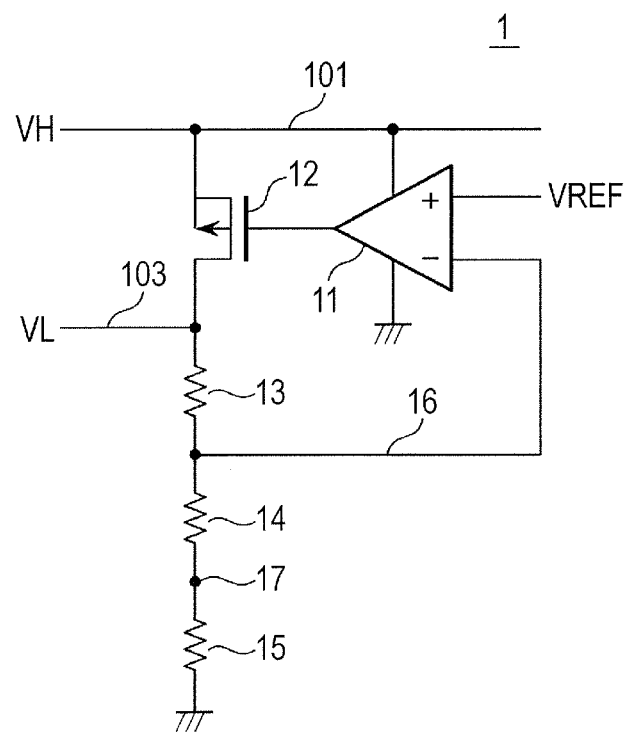
FIG. 3 is a diagram illustrating an example of a step-down circuit according to the first embodiment.

FIG. 3 is a diagram illustrating an exemplary configuration of the step-down circuit 1 according to the present embodiment. In FIG. 3, a series regulator based on a negative feedback coupled operational amplifier 11 is shown as an example of the step-down circuit. Referring to FIG. 3, the step-down circuit 1 includes the operational amplifier 11, a P-channel MOS transistor 12, and resistors 13, 14, 15. The operational amplifier 11 forms a negative feedback circuit that operates on the high power supply voltage VH and the reference voltage GND. More specifically, a reference voltage VREF is supplied to the non-inverting input of the operational amplifier. The inverting input of the operational amplifier is coupled to the node 103 and the drain of the P-channel MOS transistor 12 through the resistor 13. The output of the P-channel MOS transistor 12 is coupled to the gate of the P-channel MOS transistor 12. The P-channel MOS transistor 12 is exemplified by a power MOS transistor. The source of the P-channel MOS transistor 12 is coupled to the node 101. The drain of the P-channel MOS transistor 12 is coupled to one end of the resistor 13 through the node 103. The resistors 13, 14, 15 form a voltage divider resistor as they are series-coupled between the node 103 (the drain of the P-channel MOS transistor 12) and a reference power supply to which the reference voltage is supplied. The resistor 13 is coupled to the resistor 14 through a node 16. The resistor 14 is coupled to the resistor 15 through a node 17. The resistor 15 is coupled to the reference power supply.

The node 16 applies a voltage to the inverting input of the operational amplifier 11. This voltage is determined by dividing the voltage (low power supply voltage VL) of the node 103 in accordance with the resistance ratio between the resistor 13 and the resistors 14, 15. The operational amplifier 11 amplifies the difference between the reference voltage VREF and the voltage of the node 16, and outputs the amplified voltage difference to the gate of the P-channel MOS transistor 12. As the output voltage of the operational amplifier 11 controls the on-resistance of the P-channel MOS transistor 12, the low power supply voltage VL is decreased by a voltage value corresponding to the resistance ratio between the resistor 13 and the resistors 14, 15 and to the magnitude of the reference voltage VREF. The voltage decreased in the above manner is then output from the node 103 as the low power supply voltage VL.

In accordance with the high power supply voltage VH, the first control voltage generation circuit 2 generates the control voltage VG1, which is not higher than a predetermined value (first voltage; hereinafter referred to as the clamping voltage 601), and outputs the control voltage VG1 to the first output voltage control circuit 3 through a node 102. More specifically, if the high power supply voltage VH is not higher than the clamping voltage 601, the first control voltage generation circuit 2 outputs the high power supply voltage VH as the control voltage VG1. If, on the other hand, the high power supply voltage VH is higher than the clamping voltage 601, the first control voltage generation circuit 2 clamps the control voltage VG1 at the clamping voltage 601. Therefore, when a normal state is defined by setting the high power supply voltage VH at a level not lower than the clamping voltage 601, the control voltage VG1 is clamped at the clamping voltage 601 during the normal state. If the N-channel MOS transistor 31 is set to turn on when the clamping voltage 601 is applied to its gate, the N-channel MOS transistor 31 stays on even if the low power supply voltage VL rises. Hence, its source voltage, namely, the output power supply voltage VO applied to the node 104, is limited to not exceed a value determined by the clamping voltage 601 and the threshold voltage of the N-channel MOS transistor 31.

When the magnitude of the clamping voltage 601 is set to be not higher than the absolute maximum rated voltage of the load circuit (not shown) coupled to the node 104, the magnitude of the voltage (output power supply voltage VO) of the node 104, which is controlled by the first protection circuit 111, is limited to a voltage not higher than the absolute maximum rated voltage.

Figure 4A:
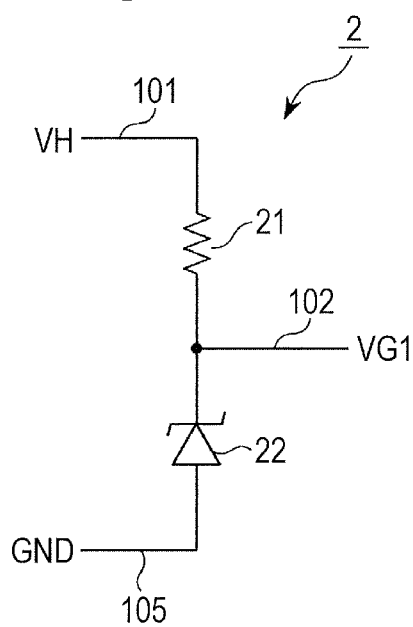
FIG. 4A is a diagram illustrating an exemplary configuration of a first control voltage generation circuit according to the first embodiment.

A concrete example of the first control voltage generation circuit 2 will now be described with reference to FIGS. 4A and 4B. FIG. 4A shows an example in which a constant voltage generation circuit based on a zener diode 22 is used as the first control voltage generation circuit 2. The first control voltage generation circuit 2 shown in FIG. 4A includes a resistor 21 and the zener diode 22, which are series-coupled between the node 101 and a node 105. The resistor 21 is coupled at one end to the node 101 to which the high power supply voltage VH is supplied, and coupled at the other end to the cathode of the zener diode through the node 102. The anode of the zener diode is coupled to the node 105 at the reference voltage GND. If the high power supply voltage VH is higher than the breakdown voltage of the zener diode 22, a current flows through the resistor 21 so that the voltage (control voltage VG1) of the node 102 to which the cathode is coupled is stabilized at the breakdown voltage. In other words, the first control voltage generation circuit 2 limits the magnitude of the control voltage VG1 by using the breakdown voltage of the zener diode 22 as the clamping voltage 601.

Figure 4B:
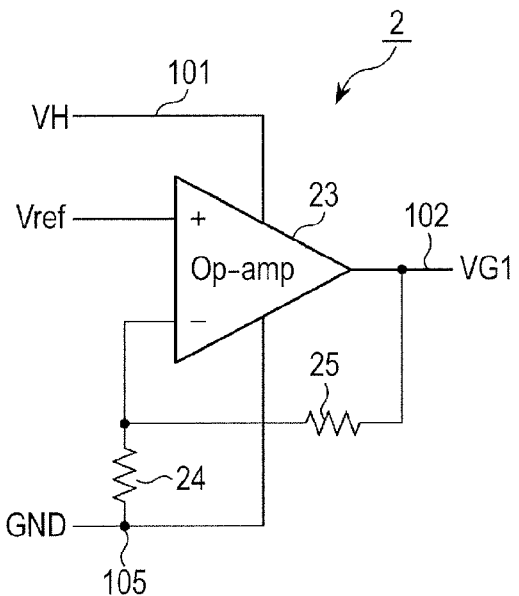
FIG. 4B is a diagram illustrating another exemplary configuration of the first control voltage generation circuit according to the first embodiment.

FIG. 4B shows an example in which a non-inverting amplifier circuit based on an operational amplifier 23 is used as the first control voltage generation circuit 2. The first control voltage generation circuit 2 shown in FIG. 4B includes the operational amplifier 23 and resistors 24, 25. The operational amplifier 23 forms a negative feedback circuit that operates on the high power supply voltage VH and the reference voltage GND. More specifically, the reference voltage VREF is supplied to the non-inverting input of the operational amplifier 23. The inverting input of the operational amplifier 23 is coupled to a coupling point of the resistors 24, 25, which are series-coupled between the node 102 and the reference power supply (node 105). The output of the operational amplifier 23 is coupled to the node 102 to output the control voltage VG1. The reference voltage VREF is generated from a stable voltage such as a BGR (Band Gap Reference). The magnitude of the control voltage, which is VG1, is expressed by the equation VG1=Vref×(R24+R25)/R24 when the resistance values of the resistors 24, 25 are R24 and R25, respectively, and the magnitude of the reference voltage VREF is Vref. Therefore, when the values of the reference voltage VREF and the resistors 24, 25 are designed so that Vref×(R2+R25)/R24 is not higher than the clamping voltage 601, the first control voltage generation circuit 2 shown in FIG. 4B limits the control voltage VG1 to a value not higher than the clamping voltage 601.

A concrete example of the first output voltage control circuit 3 will now be described with reference to FIGS. 5A and 5B. The first output voltage control circuit 3 shown in FIG. 5A includes the high-voltage N-channel MOS transistor 31. The gate of the N-channel MOS transistor 31 is coupled to the node 102. The drain of the N-channel MOS transistor 31 is coupled to the node 103. The source of the N-channel MOS transistor 31 is coupled to the node 104. It is preferred that a substrate for the N-channel MOS transistor 31 be coupled to its source in order to prevent the threshold voltage of the N-channel MOS transistor 31 from being increased due to the influence of a back-bias effect. If an increase in the threshold voltage is allowable, the substrate may be coupled to the node 105 to which the reference voltage (e.g., ground voltage GND) is supplied.

Control is exercised to maintain the gate voltage of the N-channel MOS transistor 31 at the control voltage VG1, which is not higher than the clamping voltage 601. Therefore, if the threshold voltage of the N-channel MOS transistor 31 is VTN and the gate voltage (control voltage VG1) of the N-channel MOS transistor 31 is VG1, the magnitude Vo of the output power supply voltage VO is limited to a value lower than VG1−VTN. If, in this instance, the high power supply voltage VH remains at a specified value (later-described specified voltage 600) or rises above the specified value, the control voltage VG1 is clamped at the clamping voltage 601. In this case, if the value of the clamping voltage 601 is Vmax, the magnitude Vo of the output power supply voltage VO is limited to a value lower than Vmax−VTN. In other words, when the high power supply voltage VH remains at the specified value or rises above the specified value, the low power supply voltage VL, which is greater than Vmax−VTN, does not propagate to the node 104. This prevents an overvoltage from being applied to the node 104 (load circuit not shown). Further, as the N-channel MOS transistor 31 is on in this state, a drain current flows from the node 103 to the node 104 through the N-channel MOS transistor 31. Consequently, the semiconductor device 100 according to the present embodiment supplies an adequate current for operating the load circuit coupled to the node 104 while preventing the application of an overvoltage to the node 104.

Figure 5A:
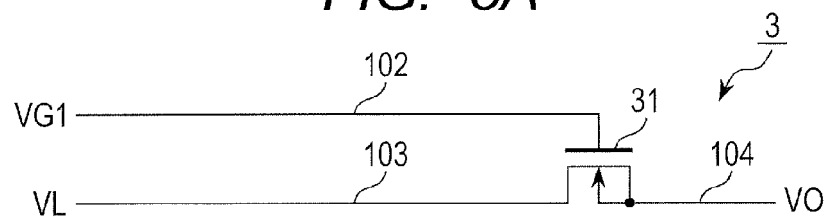
FIG. 5A is a diagram illustrating an exemplary configuration of a first output voltage control circuit according to the first embodiment.
Figure 5B:
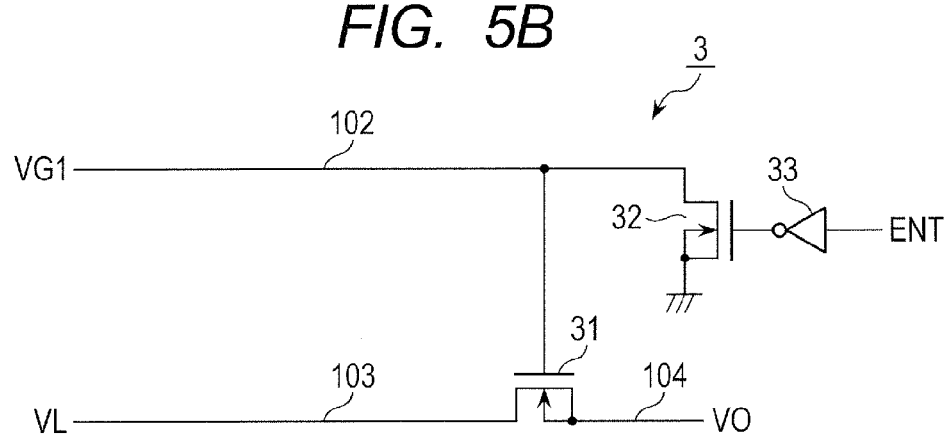
FIG. 5B is a diagram illustrating another exemplary configuration of the first output voltage control circuit according to the first embodiment.

The first output voltage control circuit 3 shown in FIG. 5B represents an example in which an N-channel MOS transistor 32 and an inverter circuit 33 are added to the circuit shown in FIG. 5A. The inverter circuit 33 outputs an inverted version of an enable signal ENT to the gate of the N-channel MOS transistor 32. The drain and source of the N-channel MOS transistor 32 are coupled between the node 102 and the node 105. In accordance with the inverted version of the enable signal ENT, the N-channel MOS transistor 32 controls the coupling between the node 102 and the node 105. The enable signal ENT is output from an overvoltage detection circuit (not shown), remains low when the high power supply voltage VH or the low power supply voltage VL is not lower than a predetermined voltage, and remains high when the high power supply voltage VH or the low power supply voltage VL is lower than the predetermined voltage.

The N-channel MOS transistor 32 turns on in response to a high-level signal output from the inverter circuit 33 and couples the node 102 to the node 105. This lowers the control voltage VG1 to a reference voltage level (the ground voltage GND in this instance) and turns off the N-channel MOS transistor 31. In other words, when the high power supply voltage VH or the low power supply voltage VL is not lower than the predetermined voltage, the N-channel MOS transistor 32 functions as a first power supply shut-off control circuit that exercises control to turn off the N-channel MOS transistor 31 and uncouples the node 101 from the node 103 to which the low power supply voltage VL is applied.

Further, the N-channel MOS transistor 32 turns off in response to a low-level signal output from the inverter circuit 33 and uncouples the node 102 from the node 105. This ensures that the voltage (control voltage VG1) of the node 102 is maintained at a voltage preselected by the first control voltage generation circuit 2. In other words, when the high power supply voltage VH or the low power supply voltage VL is lower than the predetermined voltage, the first output voltage control circuit 3 shown in FIG. 4B outputs the output power supply voltage VO based on the control voltage VG1 to the node 104, as is the case with the circuit shown in FIG. 4A.

Although the N-channel MOS transistor 32 is used as the first power supply shut-off control circuit in the above example, the above-described circuit configuration need not always be used. A different circuit configuration may alternatively be used as far as it can control the coupling between the node 102 and the node 105 in accordance with the enable signal ENT having a predetermined signal level.

<Operations>

Operations of the semiconductor device 100 according to the first embodiment will now be described. First of all, operations performed by the semiconductor device 100 when the circuit shown in FIG. 5A is used as the first output voltage control circuit 3 will be described. A battery or other DC power source (not shown) applies the high power supply voltage VH (e.g., a voltage of 12.5 V) to the node 101. Further, the load circuit (not shown), such as an internal circuit in an IC chip, is coupled to the node 104. As the load circuit may use low-voltage elements, the first protection circuit 111 should preferably incorporate the N-channel MOS transistor 31 that withstands higher voltages than the elements used in the load circuit. Further, the first control voltage generation circuit 2 should preferably be set to clamp the control voltage VG1 at the clamping voltage 601 (e.g., 7 V) when the high power supply voltage VH having a normal value (e.g., 12.5 V) is applied.

While the high power supply voltage VH having a normal value (later-described specified voltage 600) is applied, the N-channel MOS transistor 31 is on because its gate voltage (control voltage VG1) is clamped at the clamping voltage 601. During such a period, a voltage higher than a value obtained by subtracting the threshold voltage of the N-channel MOS transistor 31 from the clamping voltage 601 does not propagate to the node 104 as the output power supply voltage VO. Therefore, when the low power supply voltage VL is not lower than the clamping voltage 601, a voltage obtained by subtracting the threshold voltage of the N-channel MOS transistor 31 from the gate-source voltage (the clamping voltage 601 in this instance) is applied to the node 104 as the output power supply voltage VO. As the node 103 is coupled to the node 104 through the on-resistance of the low-loss N-channel MOS transistor 31, an adequate current for the load circuit coupled to the node 104 is supplied to the node 104.

Even when the high power supply voltage VH rises to apply an overvoltage to the node 101, the first control voltage generation circuit 2 clamps the gate voltage (control voltage VG1) of the N-channel MOS transistor 31 at the clamping voltage 601. Therefore, as mentioned earlier, a raised low power supply voltage VL does not propagate to the node 104 so that a voltage determined by the clamping voltage 601 and the threshold voltage of the N-channel MOS transistor 31 is output as the output power supply voltage VO. In this instance, too, a current necessary for the load circuit coupled to the node 104 is maintained because a drain current is supplied from the node 103 to the node 104 through the N-channel MOS transistor 31 as mentioned earlier.

Even if the node 101 and the node 103 are short-circuited so that the high power supply voltage VH, which is a high voltage, is applied to the node 103 as the low power supply voltage VL, a voltage determined by the clamping voltage 601 and the threshold voltage of the N-channel MOS transistor 31 is output as the output power supply voltage VO without allowing the raised low power supply voltage VL to propagate to the node 104 because the control voltage VG1 is clamped at the clamping voltage 601 as mentioned earlier. In this instance, too, a current necessary for the load circuit coupled to the node 104 is maintained because a drain current is supplied from the node 103 to the node 104 through the N-channel MOS transistor 31 as mentioned earlier.

When the high power supply voltage VH to be applied to the node 101 is lowered from its normal value and below the predetermined voltage, the first control voltage generation circuit 2 applies the high power supply voltage VH to the gate of the N-channel MOS transistor 31 as the control voltage VG1. In this instance, the N-channel MOS transistor 31 is on, half on, or off depending on the gate voltage. When the N-channel MOS transistor 31 is on or half on, a voltage determined by the threshold voltage of the N-channel MOS transistor 31 and the gate-source voltage (the high power supply voltage VH lower than the clamping voltage 601 in this instance) is applied to the node 104 as the output power supply voltage VO. When, on the other hand, the N-channel MOS transistor 31 is off, the node 103 is uncoupled from the node 104 so as to shut off the supply of the output power supply voltage VO to the node 104.

As described above, even when the high power supply voltage VH rises above its normal value or the low power supply voltage VL rises, the semiconductor device 100 according to the present embodiment not only limits the magnitude of the low power supply voltage VL to be propagated to the node 104, but also maintains the supply of a necessary current to the load circuit coupled to the node 104. As the present embodiment uses the N-channel MOS transistor 31 having a clamped gate voltage for the purpose of limiting the magnitude of the output power supply voltage VO to be supplied to the node 104, it is possible to not only protect the load circuit but also supply necessary electrical power to the load circuit while suppressing an increase in the area of the protection circuitry.

If a voltage not lower than the predetermined voltage is applied as the high power supply voltage VH or as the low power supply voltage VL in a situation where the circuit shown in FIG. 5B is used as the first output voltage control circuit 3, the first output voltage control circuit 3 can uncouple the node 103 from the node 104. If, in this instance, the supply of electrical power to the node 104 is shut off immediately upon detection of an overvoltage, a problem occurs as far as the overvoltage is generated due to noise. Therefore, the result of detection of the overvoltage is masked for a predetermined period of time by a delay circuit, and then input to the first output voltage control circuit 3 in the form of an enable signal ENT, ENB. The first protection circuit 111 according to the present embodiment can provide protection during an interval between the detection of overvoltage and the uncoupling between the node 103 and the node 104 so as to prevent the raised low power supply voltage VL from being applied to the node 104 from the N-channel MOS transistor 31 having a clamped gate voltage. In other words, when the N-channel MOS transistor 31 having a clamped gate voltage is incorporated in the semiconductor device 100, the timing at which the node 104 is uncoupled can be delayed for the predetermined period of time from the detection of overvoltage while limiting the magnitude of the output power supply voltage VO to be output to the node 104. This permits the semiconductor device 100 according to the present embodiment to incorporate the overvoltage detection circuit that uncouples the node 104 (load circuit) from the node 103 (power supply input terminal) in accordance with an increase in the low power supply voltage VL while eliminating the possibility of erroneous uncoupling due to noise.

2. Second Embodiment

<Configuration>

Figure 6:
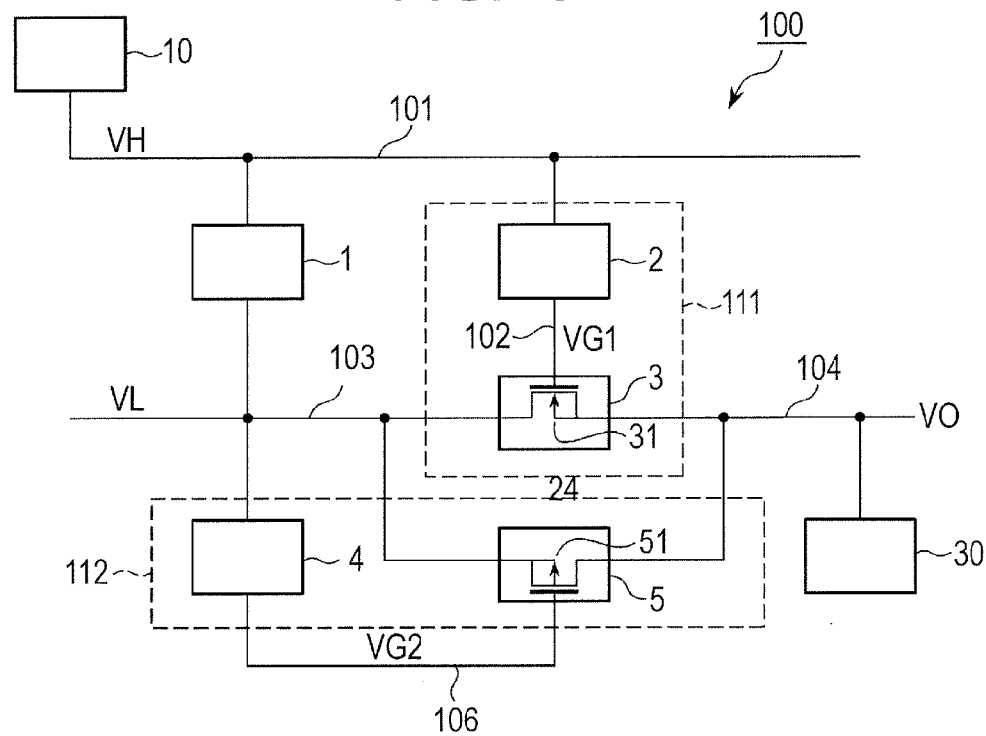
FIG. 6 is a diagram illustrating an exemplary configuration of the semiconductor device according to a second embodiment of the present invention.

The configuration of the semiconductor device 100 according to a second embodiment of the present invention will now be described in detail with reference to FIGS. 6 to 9B. FIG. 6 is a diagram illustrating an exemplary configuration of the semiconductor device 100 according to the second embodiment. Referring to FIG. 6, the semiconductor device 100 includes a step-down circuit 1, a first protection circuit 111, and a second protection circuit 112. The configurations of the step-down circuit 1 and of the first protection circuit 111 are the same as those of the corresponding elements of the first embodiment and will not be redundantly described. The second protection circuit 112 includes a second control voltage generation circuit 4 and a second output voltage control circuit 5. In an example shown in FIG. 6, a battery 10 is coupled to a node 101, and a load circuit 20 based on a low-voltage element is coupled to a node 104. The second control voltage generation circuit 4 is coupled between a node 103 and the second output voltage control circuit 5 to apply a control voltage VG2 dependent on the low power supply voltage VL to the second output voltage control circuit 5. The second output voltage control circuit 5 includes a P-channel MOS transistor 51. The source and drain of the P-channel MOS transistor 51 are coupled between the node 103 and the node 104. The control voltage VG2 is applied to the gate of the P-channel MOS transistor 51. The P-channel MOS transistor 51 controls the coupling (resistance) between the node 103 and the node 104 in accordance with the control voltage VG2 in order to control the magnitude of an output power supply voltage VO applied to the node 104.

Figure 7:
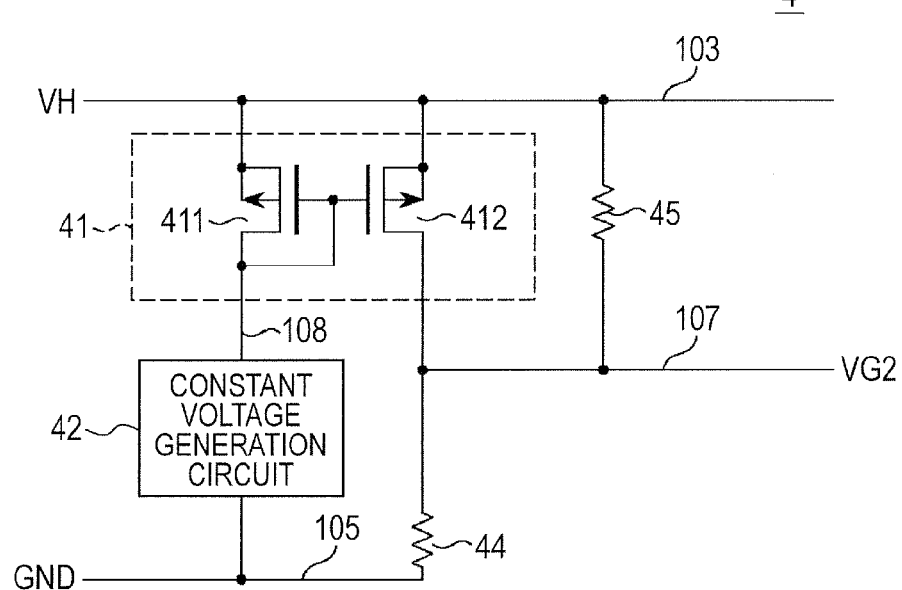
FIG. 7 is a diagram illustrating an exemplary configuration of a second control voltage generation circuit according to the second embodiment.

FIG. 7 is a diagram illustrating an exemplary configuration of the second control voltage generation circuit 4 according to the present embodiment. Referring to FIG. 7, the second control voltage generation circuit 4 includes a current mirror circuit 41, a constant voltage generation circuit 42, and resistors 44, 45. The current mirror circuit 41 includes P-channel MOS transistors 411, 412. The source of the P-channel MOS transistor 411 is coupled to the node 103 to which the low power supply voltage VL is supplied. The gate and drain of the P-channel MOS transistor 411 are coupled to the constant voltage generation circuit 42 and the gate of the P-channel MOS transistor 412 through a node 108. The source of the P-channel MOS transistor 412 is coupled to the node 103. The drain of the P-channel MOS transistor 412 is coupled to a node 105 at a reference voltage through the resistor 44. The gate of the P-channel MOS transistor 412 is coupled to the gate of the P-channel MOS transistor 411 and coupled to the constant voltage generation circuit 42 through the node 108. The P-channel MOS transistor 411 is at the input side of the current mirror circuit 41, whereas the P-channel MOS transistor 412 is at the output side of the current mirror circuit 41. The constant voltage generation circuit 42 is coupled between the node 108, which is at the high-voltage side, and the node 105, which is at the low-voltage side. Here, the reference voltage (e.g., ground voltage GND) is applied to the node 105. The resistor 44 is coupled at one end to the drain of the P-channel MOS transistor 412 through a node 107 and at the other end to the node 105 to function as a current control resistor against a mirror current. The resistor 45 is coupled between the node 103 and the node 107. The resistance value of the resistor 45 should preferably be set to be sufficiently greater than the resistance value of the resistor 44.

Figure 8A:
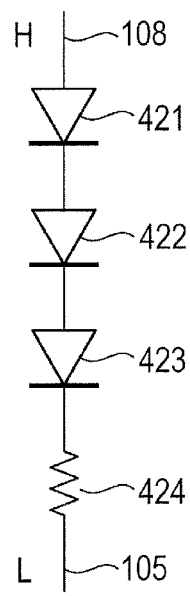
FIG. 8A is a diagram illustrating an exemplary configuration of a constant voltage generation circuit according to the second embodiment.

A concrete example of the constant voltage generation circuit 42 will now be described with reference to FIGS. 8A and 8B. An example of the constant voltage generation circuit based on a diode is shown in FIG. 8A. The constant voltage generation circuit 42 shown in FIG. 8A includes diodes 421, 422, 423 and a resistor 424. The diodes 421, 422, 423 are series-coupled in the forward direction. The anode of the diode 421 is coupled to the node 108. The cathode of the diode 423 is coupled to the node 105 through the resistor 424. When a current flows through the diodes 421, 422, 423, a constant voltage VHL is generated in the node 108 due to a voltage drop. In this instance, the resistor 424 functions as a current-limiting resistor. If the diodes 421, 422, 423 are silicon PN junction diodes, the forward-direction voltage drop per stage is approximately 0.7 V. Hence, the voltage of the node 108 is 0.7 V×3 stages=2.1 V due to the overall forward-direction voltage drop. In the example shown in FIG. 8A, a three-stage forward-direction series-coupling is exemplified. However, the number of stages is not limited to three. It is preferred that the number of stages be determined by a later-described design method.

Figure 8B:
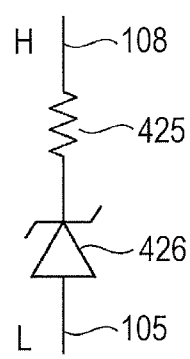
FIG. 8B is a diagram illustrating another exemplary configuration of the constant voltage generation circuit according to the second embodiment.

FIG. 8B shows an example of the constant voltage generation circuit based on a zener diode. The constant voltage generation circuit 42 shown in FIG. 8B includes a zener diode 426. The cathode of the zener diode 426 is coupled to the node 108 through a resistor 425. The cathode of the zener diode 426 is coupled to the node 105. As a breakdown current flows from the cathode of the zener diode 426 toward the anode, a constant voltage (breakdown voltage) is developed at the node 108. Here, the resistor 425 functions as a current-limiting resistor. It is preferred that the breakdown voltage of the zener diode 426 be set to an appropriate value in accordance with the later-described design method.

A concrete example of the second output voltage control circuit 5 will now be described with reference to FIGS. 9A and 9B. The second output voltage control circuit 5 shown in FIG. 9A includes a high-voltage P-channel MOS transistor 51 that is coupled at its gate to a node 106, coupled at its drain to the node 104, and coupled at its source to the node 103. It is preferred that a substrate for the P-channel MOS transistor 51 be coupled to its source in order to prevent the threshold voltage of the P-channel MOS transistor 51 from being increased due to the influence of the back-bias effect. If an increase in the threshold voltage is allowable, the substrate may be coupled to the node 105 to which the reference voltage (e.g., ground voltage GND) is supplied. The on/off operation of the P-channel MOS transistor 51 is controlled in accordance with the control voltage VG2 that is applied to its gate through the node 106.

Figure 9A:
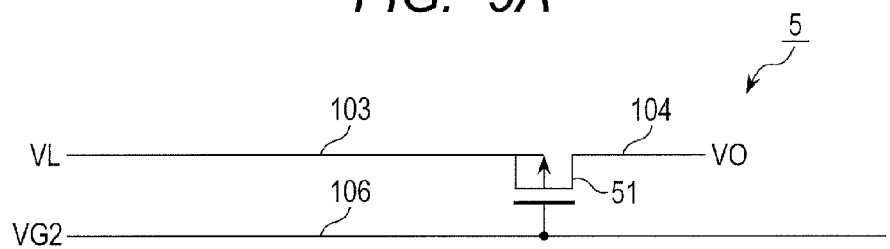
FIG. 9A is a diagram illustrating an exemplary configuration of a second output voltage control circuit according to the second embodiment.
Figure 9B:
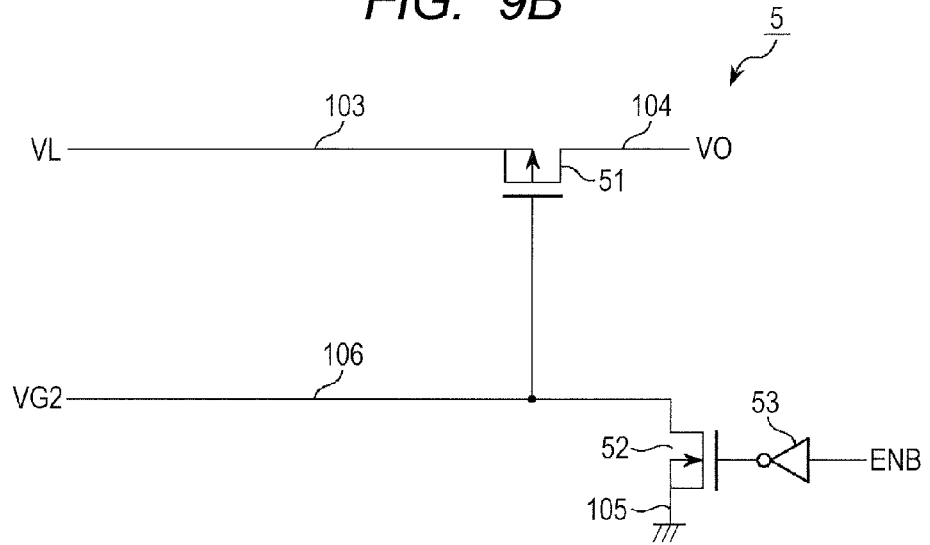
FIG. 9B is a diagram illustrating another exemplary configuration of the second output voltage control circuit according to the second embodiment.

The second output voltage control circuit 5 shown in FIG. 9B represents an example in which an N-channel MOS transistor 52 and an inverter circuit 53 are added to the circuit shown in FIG. 9A. The inverter circuit 53 outputs an inverted version of an enable signal ENB to the gate of the N-channel MOS transistor 52. The drain and source of the N-channel MOS transistor 52 are coupled between the node 106 and the node 105. In accordance with the inverted version of the enable signal ENB, the N-channel MOS transistor 52 controls the coupling between the node 106 and the node 105. The enable signal ENB is generated in accordance with a signal output from an overvoltage detection circuit (not shown), remains high when the high power supply voltage VH or the low power supply voltage VL is not lower than a predetermined voltage, and remains low when the high power supply voltage VH or the low power supply voltage VL is lower than the predetermined voltage.

The N-channel MOS transistor 52 turns on in response to a high-level signal output from the inverter circuit 53 and couples the node 106 to the node 105. This lowers the control voltage VG2 to a reference voltage level (the ground voltage GND in this instance) and turns on the P-channel MOS transistor 51. In other words, when the high power supply voltage VH or the low power supply voltage VL is lower than the predetermined voltage, the N-channel MOS transistor 52 exercises control to turn on the P-channel MOS transistor 51, and the first output voltage control circuit 3 shown in FIG. 9B controls the coupling between the node 103 and the node 104 in accordance with the control voltage VG2, as is the case with the circuit shown in FIG. 9A.

Further, the N-channel MOS transistor 52 turns off in response to a low-level signal output from the inverter circuit 53 and uncouples the node 106 from the node 105. This ensures that the voltage (control voltage VG2) of the node 106 is maintained at a voltage preselected by the second control voltage generation circuit 4. In other words, when the high power supply voltage VH or the low power supply voltage VL is not lower than the predetermined voltage, the N-channel MOS transistor 52 functions as a second power supply shut-off control circuit that clips the output power supply voltage VO applied to the node 104 at a predetermined voltage or uncouples the node 104 from the node 103 to which the low power supply voltage VL is applied.

Although the N-channel MOS transistor 52 is used as the second power supply shut-off control circuit in the above example, the above-described circuit configuration need not always be used. A different circuit configuration may alternatively be used as far as it can control the coupling between the node 106 and the node 105 in accordance with the enable signal ENB having a predetermined signal level.

<Operations>

Operations of the semiconductor device 100 according to the second embodiment will now be described. First of all, operations performed by the semiconductor device 100 when the circuit shown in FIG. 5A is used as the first output voltage control circuit 3 and the circuit shown in FIG. 9A is used as the second output voltage control circuit 5 will be described. The battery 10 applies the high power supply voltage VH, such as a voltage as high as 12.5 V, to the node 101. In this instance, however, the number of diode stages in the constant voltage generation circuit 42 is not limited to the number of stages indicated in FIG. 8A. Further, a load circuit 30 (e.g., an internal circuit in an IC chip) is coupled to the node 104. As low-voltage elements may be used in the load circuit 30, the first protection circuit 111 and the second protection circuit 112 should preferably incorporate the N-channel MOS transistor 31 and P-channel MOS transistors 411, 412, 51 that withstand higher voltages than the elements used in the load circuit 30. Further, the first control voltage generation circuit 2 should preferably be set to clamp the control voltage VG1 at the clamping voltage 601 (e.g., 7 V) when the high power supply voltage VH having a normal value (e.g., 12.5 V) is applied.

While the high power supply voltage VH having a normal value is applied, the N-channel MOS transistor 31 is on because its gate voltage (control voltage VG1) is clamped at the clamping voltage 601. During such a period, the P-channel MOS transistors 411, 412 are off so that no current flows in the current mirror circuit 41. Thus, the control voltage VG2 of the node 106, that is, the gate voltage of the P-channel MOS transistor 51, is equal to the reference voltage (ground voltage GND). Hence, the P-channel MOS transistor 51 is on. Consequently, during a normal operation, the low power supply voltage VL (e.g., 5 V) is applied to the node 104 as the output power supply voltage VO through the N-channel MOS transistor 31 and the P-channel MOS transistor 51. Further, as the N-channel MOS transistor 31 and the P-channel MOS transistor 51 exhibit a low on-resistance and a low loss, an adequate current flows to the load circuit 30.

Even when the high power supply voltage VH rises to apply an overvoltage to the node 101, the first control voltage generation circuit 2 clamps the gate voltage (control voltage VG1) of the N-channel MOS transistor 31 at the clamping voltage 601. Therefore, the N-channel MOS transistor 31 turns on. Meanwhile, if the low power supply voltage VL rises to the predetermined voltage or higher due to an increase in the high power supply voltage VH, the P-channel MOS transistors 411, 412 turn on so that a current begins to flow in the current mirror circuit 41. Due to a voltage drop caused by the mirror current in the resistor 44, the control voltage VG2 of the node 106 rises to lower the gate-source voltage of the P-channel MOS transistor 51. This limits the drain voltage of the P-channel MOS transistor 51 to a predetermined voltage. In the above period, the P-channel MOS transistor 51 operates as a variable resistor whose resistance value is controlled in accordance with the gate-source voltage. When the control voltage VG2 of the node 106 further rises so that the gate-source voltage of the P-channel MOS transistor 51 drops below its threshold voltage, the P-channel MOS transistor 51 turns off. In the above period, the node 103 is coupled to the node 104 through the N-channel MOS transistor 31 whose gate voltage is clamped by the clamping voltage 601. Hence, the output power supply voltage VO of the node 104 is limited to a value smaller than a value obtained by subtracting the threshold voltage of the N-channel MOS transistor 31 from the clamping voltage 601. Further, as the N-channel MOS transistor 31 exhibits a low on-resistance and a low loss, an adequate current flows to the load circuit 30.

Even if the node 101 and the node 103 are short-circuited so that the high power supply voltage VH, which is a high voltage, is applied to the node 103 as the low power supply voltage VL, the N-channel MOS transistor 31 turns on because the gate voltage (control voltage VG1) of the N-channel MOS transistor 31 is clamped at the clamping voltage 601 by the first control voltage generation circuit 2. Meanwhile, as the low power supply voltage VL turns out to be the high power supply voltage VH that is not lower than the predetermined voltage, the P-channel MOS transistors 411, 412 turn on. This causes a current to flow in the current mirror circuit 41. When the control voltage VG2 of the node 106 rises due to a voltage drop caused by the mirror current in the resistor 44, dropping the gate-source voltage of the P-channel MOS transistor 51 below its threshold voltage, the P-channel MOS transistor 51 turns off. In the above period, the node 103 is coupled to the node 104 through the N-channel MOS transistor 31 whose gate voltage is clamped at the clamping voltage 601. Therefore, the output power supply voltage VO of the node 104 is limited to a value smaller than a value obtained by subtracting the threshold voltage of the N-channel MOS transistor 31 from the clamping voltage 601. Further, as the N-channel MOS transistor 31 exhibits a low on-resistance and a low loss, an adequate current flows to the load circuit 30.

When the high power supply voltage VH to be applied to the node 101 is lowered from its normal value and below the predetermined voltage, the first control voltage generation circuit 2 applies the high power supply voltage VH to the gate of the N-channel MOS transistor 31 as the control voltage VG1. In this instance, the N-channel MOS transistor 31 is on, half on, or off depending on the gate voltage. When the N-channel MOS transistor 31 is on or half on, a voltage determined by the threshold voltage of the N-channel MOS transistor 31 and the gate-source voltage (the high power supply voltage VH in this instance) is applied to the node 104 as the output power supply voltage VO. When, on the other hand, the N-channel MOS transistor 31 is off, no voltage propagation path is formed between the node 103 and the node 104 through the N-channel MOS transistor 31. Meanwhile, as the low power supply voltage VL decreases due to a decrease in the high power supply voltage VH, the P-channel MOS transistors 411, 412 turn off to shut off the supply of current to the current mirror circuit 41. The control voltage VG2 of the node 106 then equals to the reference voltage (ground voltage GND), thereby turning on the P-channel MOS transistor 51. Thus, the node 103 is coupled to the node 104 through the P-channel MOS transistor 51. This applies the low power supply voltage VL to the node 104 as the output power supply voltage VO. Even if the low power supply voltage VL decreases irrespective of the high power supply voltage VH, the node 103 is coupled to the node 104 through the P-channel MOS transistor 51 in the same manner as above. This also applies the low power supply voltage VL to the node 104 as the output power supply voltage VO. In either of the above cases, an adequate current flows to the load circuit 30 as the P-channel MOS transistor 51 exhibits a low on-resistance and a low loss.

As described above, even if the high power supply voltage VH rises above its normal value or even if the low power supply voltage VL rises, the semiconductor device 100 according to the present embodiment limits the magnitude of the low power supply voltage VL to be propagated to the node 104 and maintains the supply of a necessary current to the load circuit coupled to the node 104. Further, even if the low power supply voltage VL decreases from its normal value, the semiconductor device 100 according to the present embodiment applies the decreased low power supply voltage VL to the node 104 and maintains the supply of a necessary current to the load circuit coupled to the node 104.

When the circuit shown in FIG. 5B is used as the first output voltage control circuit 3, the first output voltage control circuit 3 uncouples the node 103 from the node 104 in response to the application of the high power supply voltage VH or low power supply voltage VL not lower than the predetermined voltage, as is the case with the first embodiment. Further, when the circuit shown in FIG. 9B is used as the second output voltage control circuit 5, the second output voltage control circuit 5 applies the control voltage VG2 to the node 106 in response to the application of the high power supply voltage VH or low power supply voltage VL not lower than the predetermined voltage. If a voltage between the low power supply voltage VL and the control voltage VG2 drops below the threshold voltage of the P-channel MOS transistor 51, the node 103 is uncoupled from the node 104. If, in this instance, the supply of electrical power to the node 104 is shut off immediately upon detection of an overvoltage, a problem occurs as far as the overvoltage is generated due to noise. Therefore, the result of detection of the overvoltage is masked for a predetermined period of time by a delay circuit, and then input to the first output voltage control circuit 3 and to the second output voltage control circuit 5 in the form of an enable signal ENT, ENB. The first protection circuit 111 according to the present embodiment incorporates the N-channel MOS transistor 31 having a clamped gate voltage, as is the case with the first embodiment. Therefore, the first protection circuit 111 according to the present embodiment can prolong the time between overvoltage detection and uncoupling of the node 104 by a predetermined length of time while limiting the magnitude of the output power supply voltage VO to be output to the node 104. This permits the semiconductor device 100 according to the present embodiment to incorporate the overvoltage detection circuit that uncouples the node 104 (load circuit) from the node 103 in response to a power supply failure while eliminating the possibility of erroneous uncoupling due to noise.

As described above, even if the high power supply voltage VH rises above its normal value or even if the low power supply voltage VL rises, the semiconductor device 100 according to the present embodiment prevents the raised low power supply voltage VL from propagating to the node 104 and maintains the supply of a necessary current to the load circuit coupled to the node 104. Further, even if the low power supply voltage VL decreases, the P-channel MOS transistor 51 can maintain the supply of voltage and current to the node 104 (load circuit 30). Moreover, as the present embodiment uses the N-channel MOS transistor 31 and the P-channel MOS transistor 51 to limit the magnitude of the output power supply voltage VO for the node 104, it is possible to not only protect the load circuit but also supply necessary electrical power to the load circuit while suppressing an increase in the area of the protection circuitry.

An exemplary design of constants of the elements of the second protection circuit 112 will now be described. In the following description, it is assumed that a minimum current value prevailing when the current between the node 103 and the node 105 is maintained through the P-channel MOS transistor 411 and the constant voltage generation circuit 42 is IIn, and that the smaller current value of recommended maximum current values of the P-channel MOS transistor 411 and constant voltage generation circuit 42 is IIx, and further that threshold voltage of the P-channel MOS transistors 411, 412 is VTP. While the P-channel MOS transistor 411 is on, its source-drain voltage is substantially equal to VTP. It is also assumed that the voltage of the node 108 (the potential difference across the constant voltage generation circuit 42) is VHL while a current flows in the constant voltage generation circuit 42, and that the reference value of a recommended operating voltage for the load circuit 30 is a standard load value VnL.

When the magnitude of the high power supply voltage VH that is assumed as the maximum value of the low power supply voltage VL applied to the node 103 is VH, the resistance value R42 of the resistor 424 or the resistor 425 is set to be not lower than (VH−VTP−VHL)/IIx. This ensures that the P-channel MOS transistor 411 and the constant voltage generation circuit 42 can be operated without being damaged even when the maximum voltage assumed for the low power supply voltage VL is applied (when, for instance, the node 101 and the node 102 are short-circuited). In this instance, the voltage VHL of the node 108 is set to a value that is closest to but not greater than VnL−VTP−IIn×R42. This ensures that when the low power supply voltage VL exceeds the standard load value VnL, the input end of the current mirror circuit 41 turns on, and that the current at the input end of the current mirror circuit 41 can increase with an increase in the low power supply voltage VL.

When the magnitude of the high power supply voltage VH, which is assumed as the maximum voltage of the low power supply voltage applied to the node 103, is VH, the recommended maximum current value of the P-channel MOS transistor 412 is IOx and the resistance value of the resistor 45 is R45, the resistance value of the resistor 44 is set to be not lower than (VH−VTP)/(IOx+VTP/R45). This ensures that the current value of the P-channel MOS transistor 412 does not exceed the recommended maximum current value IOx.

3. Third Embodiment

<Configuration>

The configuration of the semiconductor device according to a third embodiment of the present invention will now be described in detail with reference to FIGS. 10 to 12. The semiconductor device according to the third embodiment includes semiconductor devices 100, 200 formed over IC chips, a high-voltage power supply terminal 201, and an output terminal 202. The semiconductor device 200 includes a step-down circuit 1, an overvoltage detection circuit 6, and a delay circuit 7, and functions as a power supply voltage generation circuit. The semiconductor device 100 includes a first protection circuit 111, a second protection circuit 112, an input terminal 203, a reference voltage power supply terminal 204, and an output power supply terminal 205, and functions as an overvoltage protection circuit. The configurations of the step-down circuit 1, of the first protection circuit 111, and of the second protection circuit 112 are the same as those of the corresponding elements of the second embodiment and will not be redundantly described.

A battery 10 is coupled to a node 101 through the high-voltage power supply terminal 201 and used to apply a DC power supply voltage VBAT to the step-down circuit 1 and to the first protection circuit 111 as a high power supply voltage VH. A node 103 positioned toward the step-down circuit 1 is coupled to a node 103 positioned toward the first and second protection circuits 111, 112 through the output terminal 202 and the input terminal 203. The step-down circuit 1 outputs an output voltage VOUT through the output terminal 202. The output voltage VOUT is then input to the input terminal 203 as an input voltage VIN. The input voltage VIN is input to the node 103 positioned toward the first and second protection circuits 111, 112 through the input terminal 203 as a low power supply voltage VL. A node 105 is coupled to the reference voltage power supply terminal 204 at a reference voltage (e.g., ground voltage GND). A node 104 is coupled to the output power supply terminal 205 so that an output power supply voltage VO controlled by the first and second protection circuits 111, 112 is applied to a load circuit 30 through the output power supply terminal 205 as an output power supply voltage VDDINT. The load circuit 30, which is formed of low-voltage elements, operates by using the output power supply voltage VDDINT as a high-voltage power supply.

In accordance with a voltage VT generated from the high power supply voltage VH, the overvoltage detection circuit 6 determines whether or not the output voltage VOUT or the input voltage VIN is higher than a predetermined voltage, and outputs the result of the determination. The determination result is input to the first and second protection circuits 111, 112 through the delay circuit 7 as an enable signal VCMPO.

Figure 11:
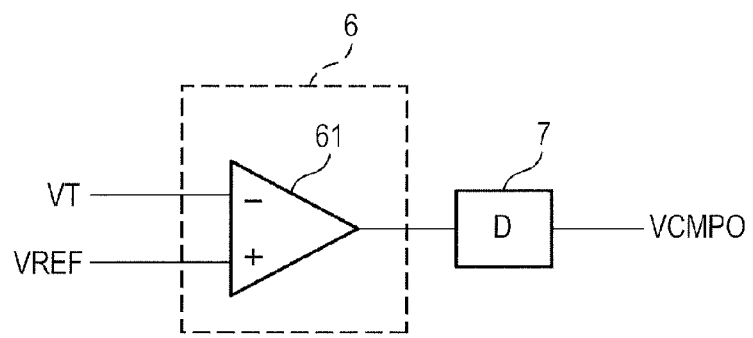
FIG. 11 is a diagram illustrating an exemplary configuration of an overvoltage detection circuit and delay circuit according to the third embodiment.

FIG. 11 is a diagram illustrating an exemplary configuration of the overvoltage detection circuit 6 and of the delay circuit 7. Referring to FIG. 11, the overvoltage detection circuit 6 includes a comparator 61. The voltage VT is applied to the inverting input of the comparator 61, and a reference voltage VREF is applied to the non-inverting input of the comparator 61. The delay circuit 7 masks the output signal of the comparator 61 for a predetermined period of time (e.g., shifts the signal to a high level). After the elapse of the predetermined period of time, the delay circuit 7 outputs the output signal of the comparator 61 as the enable signal VCMPO. The enable signal VCMPO represents a low level when the voltage VT is higher than the reference voltage VREF and represents a high level when the voltage VT is lower than the reference voltage VREF. The enable signal VCMPO is input to the first protection circuit 111 as the enable signal ENT described in conjunction with the first embodiment, and an inverted version of the enable signal ENT is input to the second protection circuit 112 as the enable signal ENB described in conjunction with the second embodiment.

A concrete example of the semiconductor device according to the third embodiment will now be described with reference to FIG. 12. The semiconductor device shown in FIG. 12 uses the circuits shown in FIGS. 3, 11, 4A, 5B, 7, 9B, and 8A, respectively, as the step-down circuit 1, the overvoltage detection circuit 6 and delay circuit 7, the first control voltage generation circuit 2, the first output voltage control circuit 3, the second control voltage generation circuit 4, the second output voltage control circuit 5, and the constant voltage generation circuit 42 of the semiconductor device shown in FIG. 10. Further, the node 104 is coupled to a plurality of load circuits 30-1, 30-2, . . . . Here, the inverting input of the comparator 61 is coupled to a node 17, which is a coupling point between resistors 14, 15, and the output (enable signal VCMPO) of the comparator 61 is input to an inverter circuit 33 through the delay circuit 7 as the enable signal ENT. The output of the inverter circuit 33 is supplied to the gate of an N-channel MOS transistor 32, and input to an inverter circuit 53 as the enable signal ENB. A capacitor 40 for a noise filter is coupled to the input terminal 203.

An exemplary operation of the semiconductor device shown in FIG. 12 will now be described with reference to FIGS. 13 and 14. In the following description, it is assumed that the DC power supply voltage VBAT in a normal state is set to 12.5 V, and that the output voltage VOUT is set to 3.3 V, and further that a control voltage VG1 is set to 5 V. In this instance, a voltage of 3.3 V is input as the input voltage VIN because the output terminal 202 is coupled to the input terminal 203 at the outside of an IC.

Figure 12:
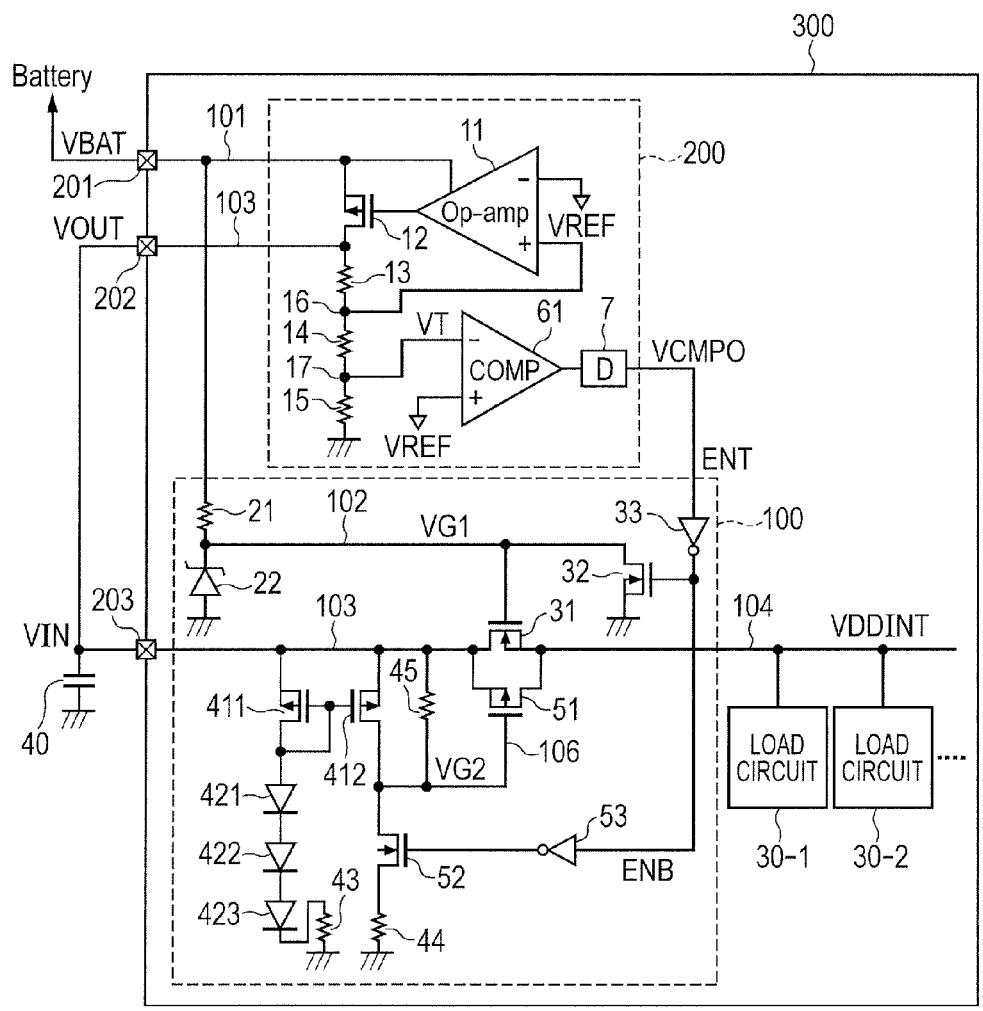
FIG. 12 is a diagram illustrating an exemplary configuration of the semiconductor device according to the third embodiment.
Figure 13:
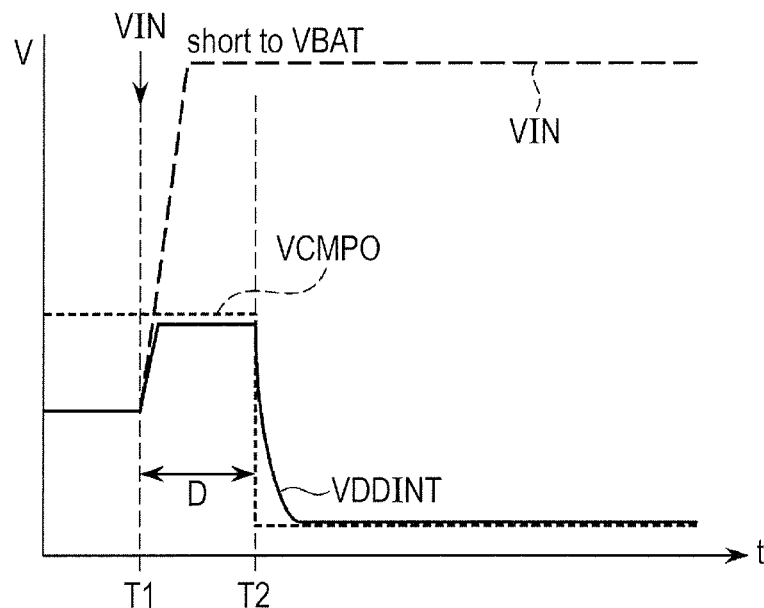
FIG. 13 is a timing diagram illustrating an example of an operation performed by the semiconductor device according to the third embodiment (when an input terminal comes into contact with a power supply line)

FIG. 13 is a timing diagram illustrating an example of an operation performed by the semiconductor device shown in FIG. 12 (when the input terminal comes into contact with a power supply line). Voltage changes occurring in the nodes when the high-voltage power supply terminal 201 is short-circuited with the output terminal 202 or with the input terminal 203 due to a certain abnormality will now be described with reference to FIG. 13.

If, at time T1, the high-voltage power supply terminal 201 is short-circuited with the output terminal 202 or with the input terminal 203, the output voltage VOUT and the input voltage VIN increase until they are equal to the DC power supply voltage VBAT, that is, 12.5 V. As the output voltage VOUT (the voltage of the node 103) increases, the comparator 61 detects an abnormality and shifts its output signal to a low level. However, the signal level of the enable signal VCMPO is maintained at a high level during a period of delay time D by the delay circuit 7, and then shifted to the same signal level (the low level in this instance) as that of the output of the comparator 61 at time T2, which is reached when the delay time D elapses after time T1.

The enable signal VCMPO is maintained at the high level during an interval between time T1 and time T2 (delay time D). Therefore, during such an interval, the enable signal ENT is at the high level, the enable signal ENB is at the low level, the N-channel MOS transistor 32 is off, and an N-channel MOS transistor 52 is on. When the N-channel MOS transistor 52 is on, a node 106 is coupled to a reference power supply through a resistor 44. This ensures that the value of a control voltage VG2 is changed in accordance with a mirror current flowing in the resistor 44. Here, as the control voltage VG2 increases to let the gate-source voltage of the P-channel MOS transistor 51 drop below its threshold voltage because of the mirror current corresponding to the raised input voltage VIN (DC power supply voltage VBAT=12.5 V), the P-channel MOS transistor 51 turns off. Further, as the N-channel MOS transistor 32 is off, an operation is performed in accordance with the control voltage VG1 applied to the gate of an N-channel MOS transistor 31. As the control voltage VG1 is clamped at a predetermined voltage (a clamping voltage 601 (e.g., 7 V) in this instance), the N-channel MOS transistor 31 exercises control so that the output power supply voltage VDDINT of the node 104 is maintained at a value not higher than the clamping voltage 601 irrespective of the input voltage VIN of the node 103. Therefore, even during the delay time D during which the signal level of the enable signal VCMPO is maintained at the high level, the N-channel MOS transistor 31 having a clamped gate voltage prevents the raised input voltage VIN from being applied to the load circuits 30-1, 30-2, . . . as the output power supply voltage VDDINT.

After time T2, the delay circuit 7 terminates its mask processing so as to output the enable signal VCMPO whose signal level is inverted from its normal level. Hence, the enable signal ENT is at the low level, the enable signal ENB is at the high level, the N-channel MOS transistor 32 is on, and the N-channel MOS transistor 52 is off. The N-channel MOS transistor 32, which is now turned on, raises the control voltage VG1 to the reference voltage (ground voltage GND), thereby turning off the N-channel MOS transistor 31. Further, the N-channel MOS transistor 52, which is now turned off, couples the gate (node 106) of the P-channel MOS transistor 51 to the node 103 through a resistor 45. The control voltage VG2 of the node 106 then rises to the voltage of the node 103 (high input voltage VIN), thereby turning off the P-channel MOS transistor 51. Consequently, after time T2, the high-voltage N-channel MOS transistor 31 and P-channel MOS transistor 51, which are turned off, prevent the raised input voltage VIN from being applied to the load circuits 30-1, 30-2, . . . as the output power supply voltage VDDINT.

An example of an operation performed when the DC power supply voltage VBAT (12.5 V) is applied as the input voltage VIN due to short-circuiting between terminals or destruction of the P-channel MOS transistor 12 will now be described. During an interval between time T1 at which the high input voltage VIN (high output voltage VOUT) is detected and time T2 (during the delay time D), the enable signal VCMPO is maintained at the high level. This ensures that the N-channel MOS transistor 32 stays off, and that the N-channel MOS transistor 52 stays on. During this interval, a current flows in the current mirror circuit formed by the P-channel MOS transistors 411, 412 because the high DC power supply voltage VBAT (12.5 V) is applied as the input voltage VIN. As a result, the gate voltage (control voltage VG2) of the P-channel MOS transistor 51 rises to turn off the P-channel MOS transistor 51.

Meanwhile, the gate voltage of the N-channel MOS transistor 31 is set at the clamping voltage 601 (e.g., 7.0 V) by the control voltage VG1. Therefore, the output power supply voltage VDDINT does not exceed 7.0 V (because a shut-off occurs if the gate-source voltage Vgs of the N-channel MOS transistor 31 is as low as 0.1 V or so). Consequently, even if the input voltage VIN is 12.5 V, the output power supply voltage VDDINT remains at 7.0 V.

Subsequently, when the enable signal VCMPO goes low level after the elapse of the delay time D, the N-channel MOS transistor 32 turns on and the N-channel MOS transistor 52 turns off. This turns off the N-channel MOS transistor 31 and holds the gate of the P-channel MOS transistor 51 at the same potential as the source through the resistor 45. Thus, the N-channel MOS transistor 31 remains off. As a result, the N-channel MOS transistor 31 and the P-channel MOS transistor 51 both turn off to shut off the supply of voltage to the load circuits 30-1, 30-2, . . . .

Figure 14:
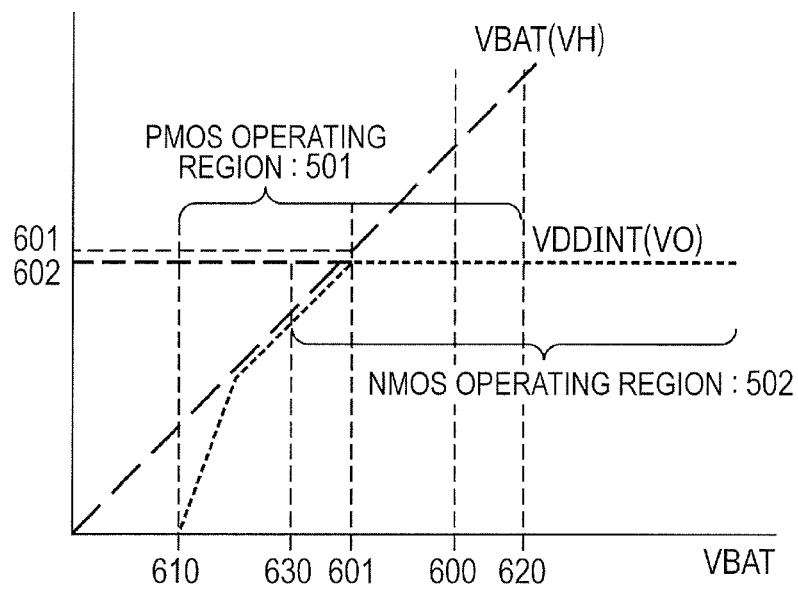
FIG. 14 is a characteristics diagram illustrating an example of an operation performed by the semiconductor device according to the third embodiment (illustrating the characteristics of an output power supply voltage VDDINT with respect to a DC power supply voltage VBAT)

FIG. 14 is a characteristics diagram illustrating an example of an operation performed by the semiconductor device according to the present embodiment (illustrating the characteristics of the output power supply voltage VDDINT with respect to the DC power supply voltage VBAT). An operation performed by the N-channel MOS transistor 31 and the P-channel MOS transistor 51 in accordance with the DC power supply voltage VBAT will now be described with reference to FIG. 14. When, in a normal state, the DC power supply voltage VBAT is equal to a specified voltage (hereinafter referred to as the specified voltage 600; e.g., 12.5 V), the input voltage VIN has a predetermined value (e.g., 5 V). In this instance, the mirror current does not flow to the P-channel MOS transistors 411, 412 so that the control voltage VG2 is equal to the reference voltage (ground voltage GND). Thus, the P-channel MOS transistor 51 turns on. Further, as the control voltage VG1 is clamped at the clamping voltage 601 (e.g., 7 V), the N-channel MOS transistor 31 turns on. Thus, the output power supply voltage VDDINT has a value (voltage 602) that is obtained by subtracting the threshold voltage of the N-channel MOS transistor 31 from the clamping voltage 601 applied to the gate.

When the DC power supply voltage VBAT rises above the specified voltage 600 and exceeds a predetermined voltage 620, the input voltage VIN exceeds the predetermined value. In this instance, the mirror current flows in the P-channel MOS transistors 411, 412, thereby raising the control voltage VG2. When the gate-source voltage of the P-channel MOS transistor 51 drops below its threshold voltage, the P-channel MOS transistor 51 turns off. Meanwhile, the control voltage VG1 is clamped at the clamping voltage 601 (e.g., 7 V) even if the DC power supply voltage VBAT rises. Therefore, the N-channel MOS transistor 31 turns on so that the output power supply voltage VDDINT has a value (voltage 602) that is obtained by subtracting the threshold voltage of the N-channel MOS transistor 31 from the clamping voltage 601 applied to the gate. In other words, when the DC power supply voltage VBAT exceeds the predetermined voltage 620, the N-channel MOS transistor 31 turns on and the P-channel MOS transistor 51 turns off. Hence, the output power supply voltage VDDINT is clamped at the voltage 602 irrespective of the magnitude of the DC power supply voltage VBAT.

When the DC power supply voltage VBAT decreases from the specified voltage 600 and drops below the predetermined voltage (clamping voltage 601), the DC power supply voltage VBAT is supplied to the gate of the N-channel MOS transistor 31 as the control voltage VG1. In this instance, the output power supply voltage VDDINT has a value that is obtained by subtracting the threshold voltage of the N-channel MOS transistor 31 from the DC power supply voltage VBAT. If the DC power supply voltage VBAT further decreases and drops below a predetermined voltage 630, the N-channel MOS transistor 31 turns off. However, if the DC power supply voltage VBAT drops below the voltage 630 but remains above a predetermined voltage 610 (if the input voltage VIN is above a predetermined value and the gate-source voltage of the P-channel MOS transistor 51 is not lower than its threshold voltage), the P-channel MOS transistor 51 turns on. In this instance, the enable signal VCMPO is high. Therefore, the N-channel MOS transistor 52 is on with the control voltage VG2 raised to the reference voltage (ground voltage GND).

As such being the case, the P-channel MOS transistor 51 is on when the DC power supply voltage VBAT is between the voltage 610 and the voltage 620 (PMOS operating region 501) and off when the DC power supply voltage VBAT is above the voltage 620. Further, the N-channel MOS transistor 31 is on when the DC power supply voltage VBAT is above the voltage 630 (NMOS operating region 502) and off when the DC power supply voltage VBAT is below the voltage 630.

The operation described above will now be summarized. When the DC power supply voltage VBAT is between the voltage 610 and the voltage 630, the P-channel MOS transistor 51 is on and the N-channel MOS transistor 31 is off. In this instance, the output power supply voltage VDDINT has a value corresponding to the input voltage VIN applied through the P-channel MOS transistor 51. When the DC power supply voltage VBAT is between the voltage 630 and the voltage 620, the N-channel MOS transistor 31 and the P-channel MOS transistor 51 are both on. In this instance, the output power supply voltage VDDINT has a value controlled by the gate voltage of the N-channel MOS transistor 31. When the DC power supply voltage VBAT is above the clamping voltage 601, the output power supply voltage VDDINT is clamped at the predetermined voltage 602 because the gate voltage (control voltage VG1) of the N-channel MOS transistor 31 is clamped at the clamping voltage 601. When the DC power supply voltage VBAT exceeds the voltage 620, the P-channel MOS transistor 51 turns off and the N-channel MOS transistor 31 turns on. In this instance, the output power supply voltage VDDINT is equal to the voltage 602 that is controlled by the clamped gate voltage of the N-channel MOS transistor 31. It is preferred that the specified voltage 600 be set to a value not lower than the clamping voltage 601.

As described above, even when the DC power supply voltage VBAT rises or drops, the semiconductor device according to the present embodiment uses the N-channel MOS transistor 31 and the P-channel MOS transistor 51 to protect the load circuits 30 against an overvoltage and supply necessary electrical power to the load circuits 30.

Concrete examples of operations performed by the semiconductor device according to the present embodiment when the input voltage VIN rises or drops will now be described.

First of all, an example of an operation performed when the input voltage VIN rises due to an increase in the DC power supply voltage VBAT or due to short-circuiting between terminals or destruction of the P-channel MOS transistor 12 will be described. When the N-channel MOS transistor 52 is on, a current flows in the current mirror circuit formed by the P-channel MOS transistors 411, 412 because a high voltage is applied as the input voltage VIN. This raises the gate voltage (control voltage VG2) of the P-channel MOS transistor 51, thereby turning off the P-channel MOS transistor 51.

Meanwhile, the gate voltage of the N-channel MOS transistor 31 is set at the clamping voltage 601 (e.g., 7.0 V) by the control voltage VG1. Therefore, the output power supply voltage VDDINT does not exceed 7.0 V (because a shut-off occurs if the gate-source voltage Vgs of the N-channel MOS transistor 31 is as low as 0.1 V or so). Consequently, even if the input voltage VIN is 12.5 V, the output power supply voltage VDDINT remains at 7.0 V.

Next, a concrete example of an operation performed when the DC power supply voltage VBAT drops will be described. First of all, when the DC power supply voltage VBAT drops to 4.0 V, the control voltage VG1 is also clipped at 4.0 V. In this instance, the output voltage VOUT and the input voltage VIN are both 3.3 V, and the output power supply voltage VDDINT is approximately 3.3 V. Therefore, the gate-source voltage Vgs of the N-channel MOS transistor 31 drops to 0.7 V or so. This causes the on-resistance of the N-channel MOS transistor 31 to suddenly increase, thereby increasing the load on the load circuits coupled to the node 104. When the load on the load circuits increases, the output power supply voltage VDDINT decreases.

In the above instance, however, almost no current flows in the current mirror circuit formed by the P-channel MOS transistors 411, 412. Therefore, when the N-channel MOS transistor 52 is on, a current is drawn by the resistor 44. Hence, the gate voltage (control voltage VG2) of the P-channel MOS transistor 51 is substantially at the level of the reference voltage (ground voltage GND) so that the P-channel MOS transistor 51 remains on. In other words, as the on-resistance of the P-channel MOS transistor 51 can be maintained sufficiently low even when the DC power supply voltage VBAT drops, the output power supply voltage VDDINT can be maintained at approximately 3.3 V.

In the semiconductor device according to the present embodiment, the input voltage VIN is applied as the output power supply voltage VDDINT by the P-channel MOS transistor 51 in the "on" state when the DC power supply voltage VBAT and the input voltage VIN are lowered. This makes it possible to avoid a drastic decrease in the output power supply voltage (an instantaneous interruption) with respect to the load circuits 30.

As described above, the semiconductor device according to the present embodiment can protect the low-voltage load circuits 30 during the time interval between the instant at which the comparator 61 detects the high input voltage VIN and the instant at which the node 103 is uncoupled from the node 104. Further, when the DC power supply voltage VBAT or the input voltage VIN rises above a predetermined value, the semiconductor device according to the present embodiment can supply necessary electrical power to the load circuits 30 while limiting the output power supply voltage VDDINT to a predetermined value. Moreover, even when the DC power supply voltage VBAT or the input voltage VIN drops below a predetermined value, the semiconductor device according to the present embodiment can maintain the operations of the load circuits 30 without drastically increasing the resistance between the node 103 and the node 104.

Exemplary modifications of the semiconductor device shown in FIG. 12 will now be described with reference to FIGS. 15 to 20.

Figure 10:
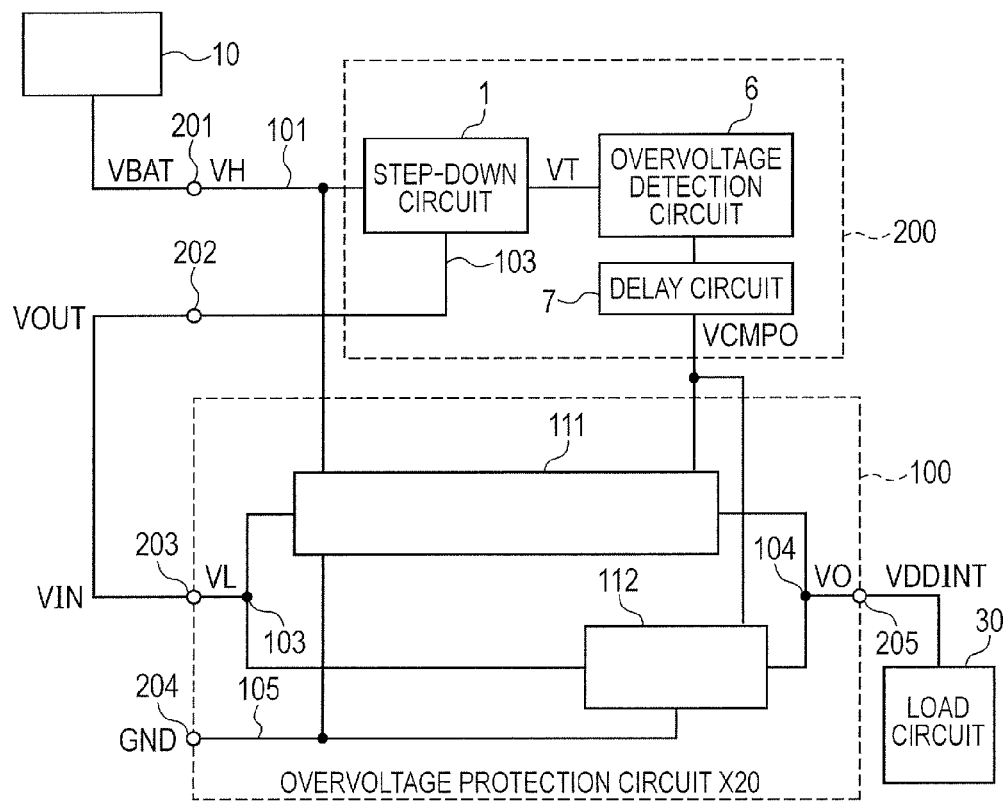
FIG. 10 is a diagram illustrating an exemplary configuration of the semiconductor device according to a third embodiment of the present invention.
Figure 15:
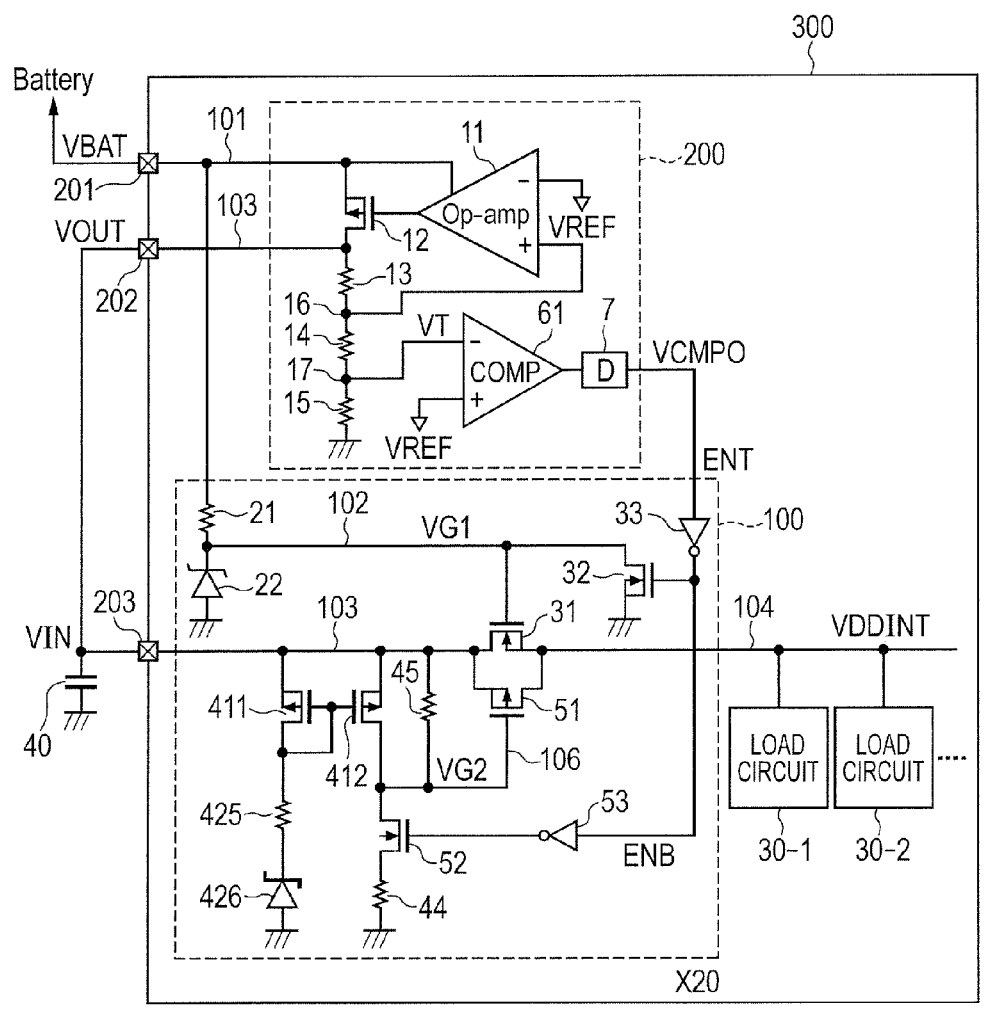
FIG. 15 is a diagram illustrating a modified example of the semiconductor device shown in FIG. 12.

The semiconductor device shown in FIG. 15 uses the circuits shown in FIGS. 3, 11, 4A, 5B, 7, 9B, and 8B, respectively, as the step-down circuit 1, the overvoltage detection circuit 6 and delay circuit 7, the first control voltage generation circuit 2, the first output voltage control circuit 3, the second control voltage generation circuit 4, the second output voltage control circuit 5, and the constant voltage generation circuit 42 of the semiconductor device shown in FIG. 10. In other words, the semiconductor device shown in FIG. 15 is a device that is obtained by replacing the constant voltage generation circuit 42 of the semiconductor device shown in FIG. 12 with a circuit based on the zener diode 426 shown in FIG. 8B.

The operations of the semiconductor device shown in FIG. 15 are the same as those of the semiconductor device shown in FIG. 12. However, adjusting the characteristics of the resistor 425 and of the zener diode 426 makes it possible to adjust the PMOS operating region 501 and adjust the relationship between the input voltage VIN and the control voltage VG2 that turns off the P-channel MOS transistor 51.

Figure 16:
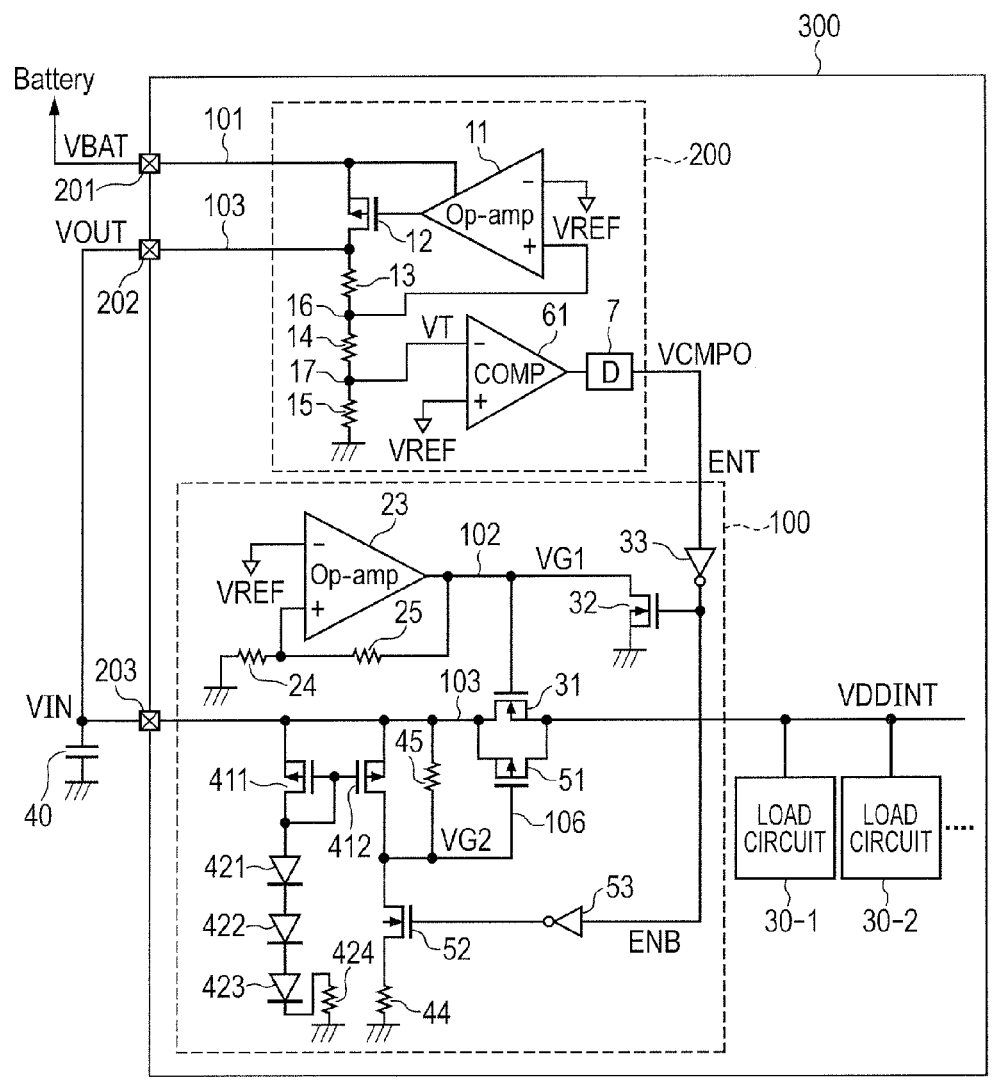
FIG. 16 is a diagram illustrating another modified example of the semiconductor device shown in FIG. 12.

The semiconductor device shown in FIG. 16 uses the circuits shown in FIGS. 3, 11, 4B, 5B, 7, 9B, and 8A, respectively, as the step-down circuit 1, the overvoltage detection circuit 6 and delay circuit 7, the first control voltage generation circuit 2, the first output voltage control circuit 3, the second control voltage generation circuit 4, the second output voltage control circuit 5, and the constant voltage generation circuit 42 of the semiconductor device shown in FIG. 10. In other words, the semiconductor device shown in FIG. 16 is a device that is obtained by replacing the first control voltage generation circuit 2 of the semiconductor device shown in FIG. 12 with a circuit based on the operational amplifier 23 shown in FIG. 4B.

The operations of the semiconductor device shown in FIG. 16 are the same as those of the semiconductor device shown in FIG. 12. However, allowing the operational amplifier 23 to adjust the control voltage VG1 makes it possible to adjust the maximum value of the output power supply voltage VDDINT that prevails when an overvoltage is applied as the input voltage VIN.

Figure 17:
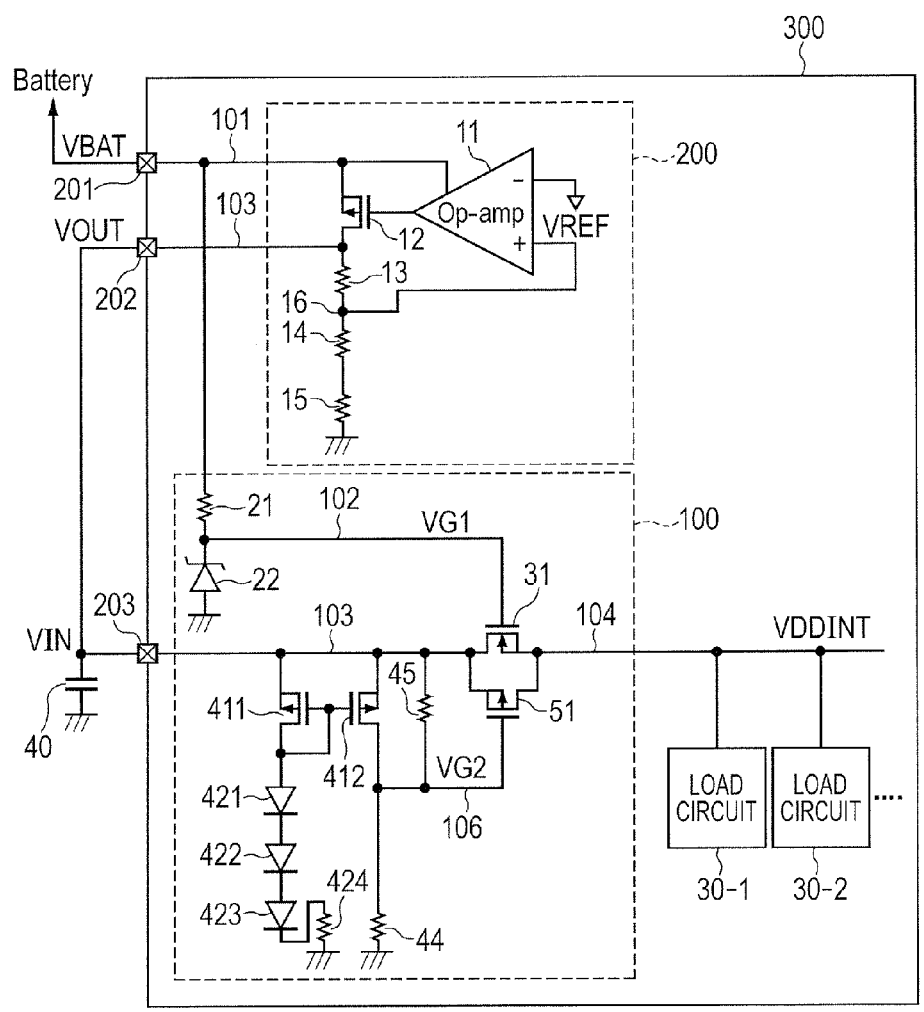
FIG. 17 is a diagram illustrating yet another modified example of the semiconductor device shown in FIG. 12.

The semiconductor device shown in FIG. 17 is obtained by eliminating the overvoltage detection circuit 6 and the delay circuit 7 from the semiconductor device shown in FIG. 10, and uses the circuits shown in FIGS. 3, 4A, 5A, 7, 9A, and 8A, respectively, as the step-down circuit 1, the first control voltage generation circuit 2, the first output voltage control circuit 3, the second control voltage generation circuit 4, the second output voltage control circuit 5, and the constant voltage generation circuit 42 of the semiconductor device shown in FIG. 10. In other words, the semiconductor device shown in FIG. 17 is a device that is obtained by eliminating a power supply shut-off circuit related to overvoltage detection and the first control voltage generation circuit 2 from the semiconductor device shown in FIG. 12.

The operations of the semiconductor device shown in FIG. 17 are the same as those of the semiconductor device shown in FIG. 12 except that a power supply shut-off operation is not performed in response to overvoltage detection. The semiconductor device according to the present exemplary modification does not perform the power supply shut-off operation in response to overvoltage detection. However, as the output power supply voltage VDDINT is limited by the control voltage VG1, the load circuits 30 can continue with their operations without being destroyed. If, for instance, the node 103 is uncoupled from the node 104 while system control is provided by the load circuits 30, the load circuits 30 cannot continuously provide system control. However, the semiconductor device according to the present embodiment can provide continuous control until the whole system safely terminates because the N-channel MOS transistor 31 can maintain the output power supply voltage VDDINT at a predetermined voltage.

Figure 18:
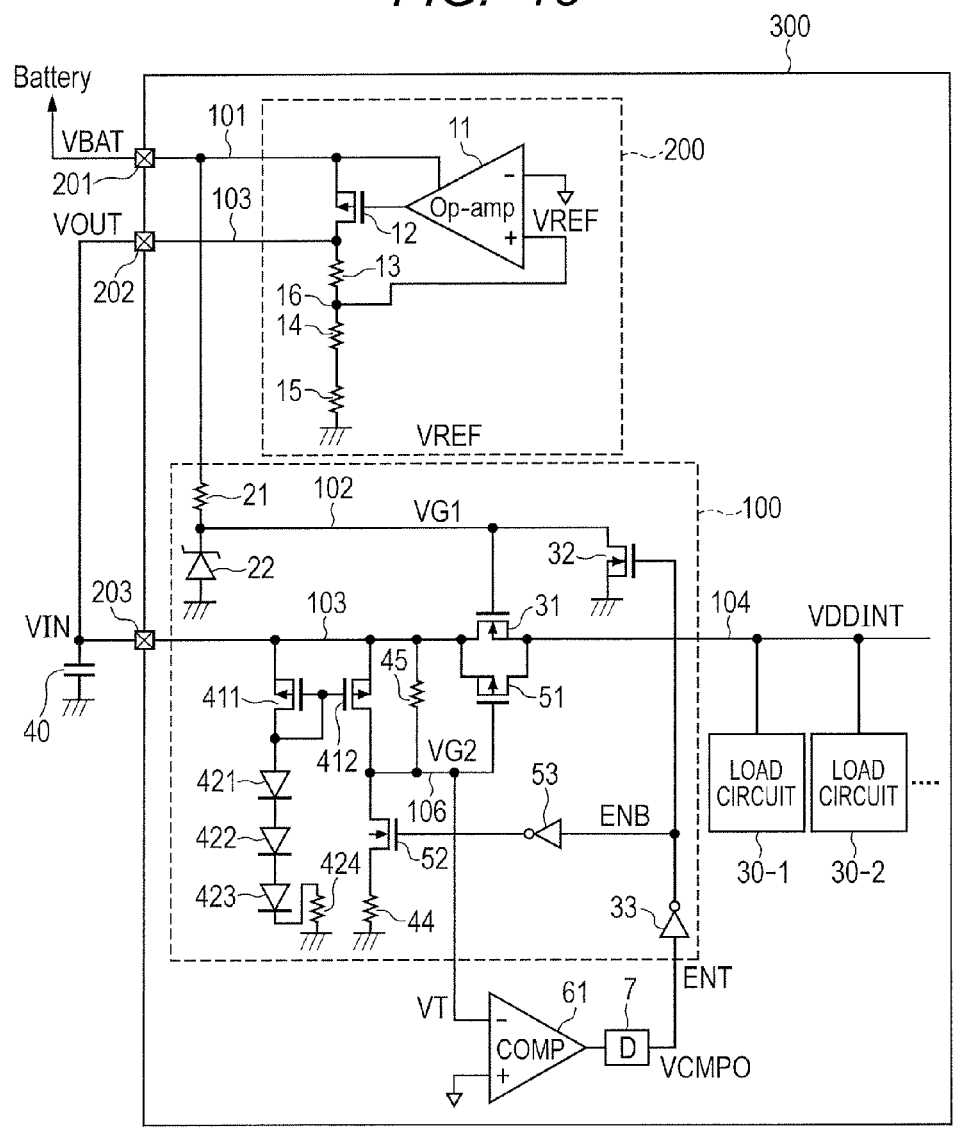
FIG. 18 is a diagram illustrating still another modified example of the semiconductor device shown in FIG. 12.

The semiconductor device shown in FIG. 18 uses the circuits shown in FIGS. 3, 11, 4A, 5B, 7, 9B, and 8A, respectively, as the step-down circuit 1, the overvoltage detection circuit 6 and delay circuit 7, the first control voltage generation circuit 2, the first output voltage control circuit 3, the second control voltage generation circuit 4, the second output voltage control circuit 5, and the constant voltage generation circuit 42 of the semiconductor device shown in FIG. 10. Here, the inverting input of the comparator 61 is coupled to the node 106, which is the gate of the P-channel MOS transistor 51, and the output (enable signal VCMPO) of the comparator 61 is input to the inverter circuit 33 through the delay circuit 7 as the enable signal ENT. The output of the inverter circuit 33 is supplied to the gate of the N-channel MOS transistor 32, and input to the inverter circuit 53 as the enable signal ENB. In other words, the semiconductor device shown in FIG. 18 is a device that is obtained by replacing the input of the comparator 61 in the semiconductor device shown in FIG. 12 with the node 106 to which the control voltage VG2 is applied.

The operations of the semiconductor device shown in FIG. 18 are the same as those of the semiconductor device shown in FIG. 12 except that the comparator 61 monitors a different voltage. The semiconductor device shown in FIG. 18 is the same as the semiconductor device shown in FIG. 12 in that when an abnormal high voltage is applied as the output voltage VOUT and as the input voltage VIN, the comparator 61 detects such an abnormality and cuts (turns off) the coupling between the node 103 and the node 104. However, even if the output terminal 202 is uncoupled from the input terminal 203 to allow a high voltage to be applied to the input terminal 203 only, the semiconductor device shown in FIG. 18 can detect an overvoltage and cut the coupling between the associated nodes.

Figure 19:
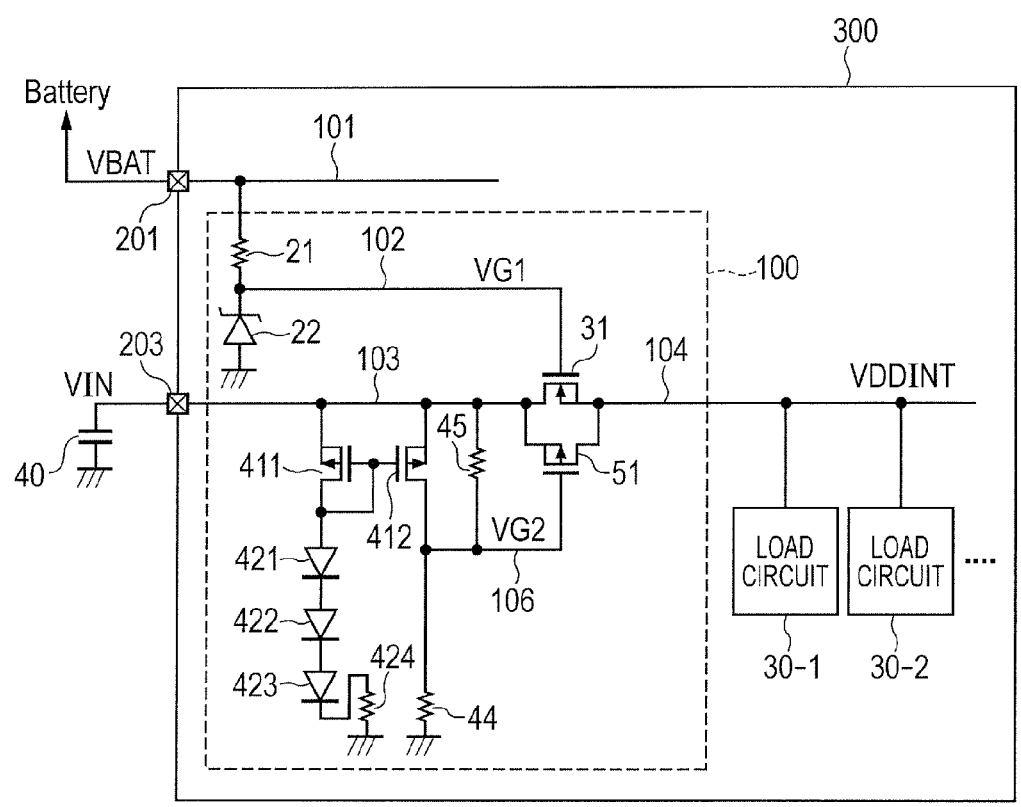
FIG. 19 is a diagram illustrating an additional modified example of the semiconductor device shown in FIG. 12.

The semiconductor device shown in FIG. 19 is obtained by eliminating the step-down circuit 1, the overvoltage detection circuit 6, and the delay circuit 7 from the semiconductor device shown in FIG. 10, and uses the circuits shown in FIGS. 4A, 5A, 7, 9A, and 8A, respectively, as the first control voltage generation circuit 2, the first output voltage control circuit 3, the second control voltage generation circuit 4, the second output voltage control circuit 5, and the constant voltage generation circuit 42 of the semiconductor device shown in FIG. 10. In other words, the semiconductor device shown in FIG. 19 is a device that is obtained by eliminating the step-down circuit 1, a power supply shut-off circuit related to overvoltage detection, and the first control voltage generation circuit 2 from the semiconductor device shown in FIG. 12.

The operations of the semiconductor device shown in FIG. 19 are the same as those of the semiconductor device shown in FIG. 12 except that a power supply shut-off operation is not performed in response to overvoltage detection. The semiconductor device according to the present exemplary modification does not have the step-down circuit 1 in an IC, but is capable of continuously operating while protecting the load circuits 30 even when the input voltage VIN is supplied from the outside. Further, although the semiconductor device according to the present exemplary modification does not perform the power supply shut-off operation in response to overvoltage detection, as is the case with the semiconductor device shown in FIG. 17, the semiconductor device according to the present exemplary modification permits the load circuits to continuously operate without being destroyed because the output power supply voltage VDDINT is limited by the control voltage VG1.

Figure 20:
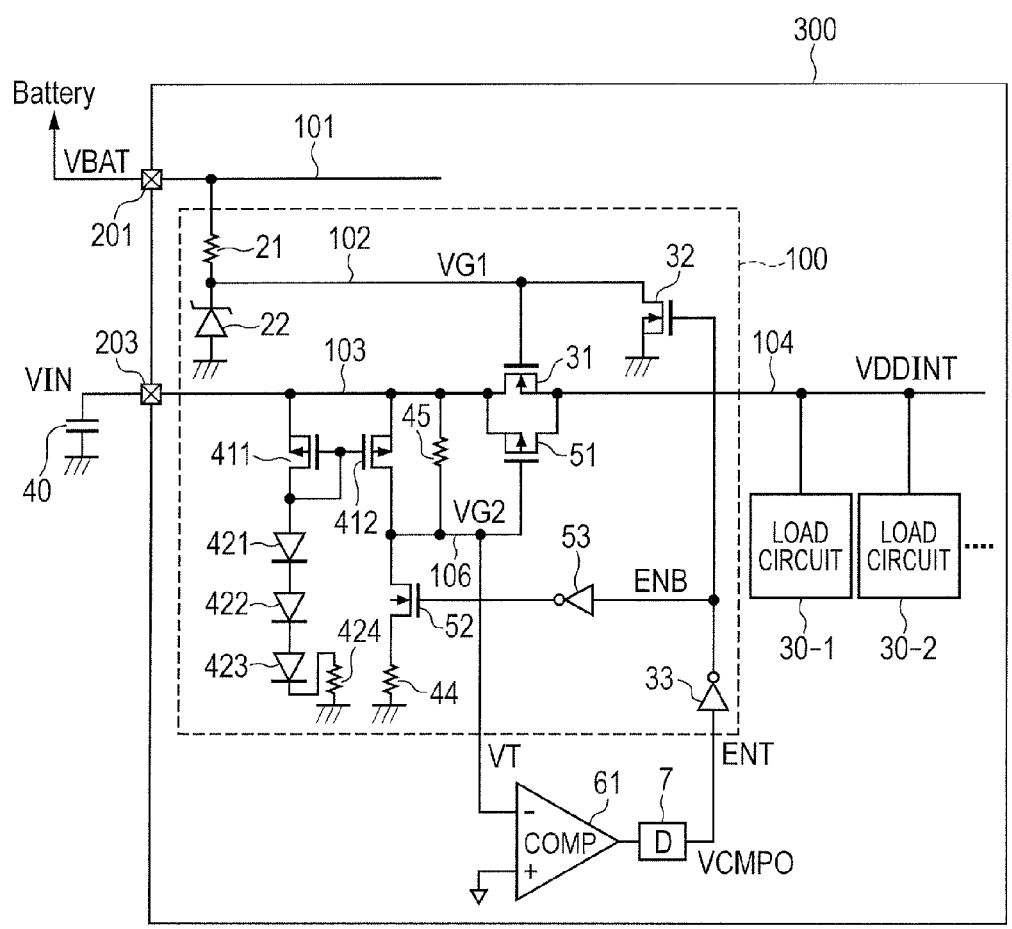
FIG. 20 is a diagram illustrating a yet additional modified example of the semiconductor device shown in FIG. 12.

The semiconductor device shown in FIG. 20 is obtained by eliminating the step-down circuit 1 from the semiconductor device shown in FIG. 10, and uses the circuits shown in FIGS. 11, 4A, 5A, 7, 9A, and 8A, respectively, as the overvoltage detection circuit 6 and delay circuit 7, the first control voltage generation circuit 2, the first output voltage control circuit 3, the second control voltage generation circuit 4, the second output voltage control circuit 5, and the constant voltage generation circuit 42 of the semiconductor device shown in FIG. 10. Here, the inverting input of the comparator 61 is coupled to the node 106, which is the gate of the P-channel MOS transistor 51, and the output (enable signal VCMPO) of the comparator 61 is input to the inverter circuit 33 through the delay circuit 7 as the enable signal ENT. The output of the inverter circuit 33 is supplied to the gate of the N-channel MOS transistor 32, and input to the inverter circuit 53 as the enable signal ENB. In other words, the semiconductor device shown in FIG. 20 is a device that is obtained by eliminating the step-down circuit 1 from the semiconductor device shown in FIG. 18.

The operations of the semiconductor device shown in FIG. 20 are the same as those of the semiconductor device shown in FIG. 18. The semiconductor device according to the present exemplary modification does not have the step-down circuit 1 in an IC, and is capable of controlling the uncoupling between the node 103 and the node 104 in accordance with the result of monitoring the input voltage VIN and continuously operating while protecting the load circuits 30 even when the input voltage VIN is supplied from the outside.

The semiconductor device according to the foregoing embodiments can not only provide overvoltage protection by using high-voltage N-channel MOS transistors and P-channel MOS transistor, but also supply a necessary current to load circuits. Further, the semiconductor conductor can supply electrical power to the load circuits even when power interruption in response to overvoltage detection is delayed. This makes it possible to prevent instantaneous power interruption and power interruption due to erroneous noise detection. Moreover, as the MOS transistors can provide overvoltage protection and assure continuous operation, it is possible to suppress an area increase by protection circuitry.

The semiconductor device according to the foregoing embodiments is ideally used in a power supply circuit that uses the DC power supply voltage VBAT supplied from a DC power source exemplified by an automotive battery. For example, even when a wire comes into contact with a power supply line due, for instance, to vibration or a piece of metal, a surge occurs, or a battery power supply operates in an unstable manner, the semiconductor device according to the foregoing embodiments makes it possible to protect load circuits. The DC power source is not limited to an automotive battery. Any other DC power sources (batteries used in an airplane, a ship, or any other moving vehicle and batteries used as a household power source) may be used.

While the embodiments of the present invention have been described in detail, the present invention is not limited to the specific configurations described in conjunction with the foregoing embodiments. It is to be understood that variations and modifications of the present invention may be made without departing from the spirit and scope of the present invention. The first to third embodiments and the modifications thereof may be variously combined within the range of technical feasibility.

What is claimed is:

1. A semiconductor device comprising:
   an input power supply terminal configured to receive a first voltage;
   a step-down circuit configured to generate a second voltage based on the first voltage, the step-down circuit being coupled with the input power supply terminal and having an output node configured to supply the second voltage;
   an output power supply terminal configured to be coupled to a load circuit; an N-channel MOSFET whose drain, source and gate are coupled with the output node of the step-down circuit, the output power supply terminal and the input power supply terminal, respectively;
   a P-channel MOSFET whose drain, source and gate are coupled with the output power supply terminal, the output node of the step-down circuit and the output node of the step-down circuit, respectively.

2. The semiconductor device according to claim 1, further comprising:
   a first resistor including a first electrode and a second electrode, the first electrode being coupled with the input power supply terminal; and
   a zener diode including an anode and a cathode, the anode being coupled with ground voltage and the gate of the N-channel MOSFET, the cathode being coupled with the second electrode of the first resistor.

3. The semiconductor device according to claim 1, wherein the gate of the P-channel MOSFET and the output node of the step-down circuit are coupled via a second resistor.

4. The semiconductor device according to claim 1, wherein the first voltage is a DC voltage.

5. A semiconductor device comprising:
   a step-down circuit configured to step-down a first voltage and output a second voltage;
   an N-channel MOSFET including a drain that receives a third voltage that is associated with the second voltage, a gate that receives a fourth voltage that is associated with the first voltage, and a source that is coupled with an output terminal; and
   a P-channel MOSFET including a drain that is coupled with the output terminal, a source that receives the third voltage, and a gate that is coupled with the source of the P-channel MOSFET.

6. The semiconductor device according to claim 5, wherein the N-channel MOSFET is configured to control, in accordance with the fourth voltage, a coupling resistance between a first node, which connects the gate and source of the P-channel MOSFET, and a second node, which connects the source of the N-channel MOSFET with the drain of the P-channel MOSFET.

7. The semiconductor device according to claim 6, wherein controlling the coupling resistance between the first node and the second node controls a magnitude of an output power supply voltage output from the output terminal.

8. The semiconductor device according to claim 5, wherein the gate of the P-channel MOSFET is configured to receive a fifth voltage, and
   in response to detecting an overcurrent, the semiconductor device controls the fourth voltage and the fifth voltage so that the N-channel MOSFET and the P-channel MOSFET shut off a supply of power to the output terminal.

* * * * *